United States Patent
Kanaya et al.

(10) Patent No.: US 7,102,273 B2
(45) Date of Patent: Sep. 5, 2006

(54) PIEZOELECTRIC ELEMENT FORMATION MEMBER INCORPORATED IN PIEZOELECTRIC ELEMENT FORMATION UNIT, PIEZOELECTRIC ACTUATOR UNIT AND LIQUID EJECTION HEAD

(75) Inventors: Munehide Kanaya, Nagano (JP); Tsuyoshi Kitahara, Nagano (JP); Noriaki Okazawa, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 162 days.

(21) Appl. No.: 10/792,392

(22) Filed: Mar. 4, 2004

(65) Prior Publication Data

US 2004/0251783 A1 Dec. 16, 2004

(30) Foreign Application Priority Data

Mar. 4, 2003 (JP) ............................ P2003-057834
Mar. 10, 2003 (JP) ............................ P2003-114985

(51) Int. Cl.
*H01L 41/083* (2006.01)
*H01L 41/047* (2006.01)

(52) U.S. Cl. ...................................... 310/328; 310/366
(58) Field of Classification Search ................ 310/328, 310/365, 366
See application file for complete search history.

(56) References Cited

U.S. PATENT DOCUMENTS

| | | | |
|---|---|---|---|
| 6,700,307 B1 * | 3/2004 | Kitahara | 310/328 |
| 6,747,396 B1 * | 6/2004 | Blom | 310/328 |
| 2001/0017503 A1 * | 8/2001 | Kitahara | 310/328 |
| 2003/0020371 A1 * | 1/2003 | Nakatani | 310/328 |
| 2003/0042821 A1 * | 3/2003 | Blom et al. | 310/328 |

FOREIGN PATENT DOCUMENTS

| JP | 2000-94677 A | 4/2000 |
|---|---|---|
| JP | 2001-277525 A | 10/2001 |

\* cited by examiner

*Primary Examiner*—Thomas M. Dougherty
(74) *Attorney, Agent, or Firm*—Sughrue Mion, PLLC

(57) ABSTRACT

First internal electrode layers and second internal electrode layers are alternately laminated in a substrate while sandwiching piezoelectric layers therebetween. The first internal electrode layers are exposed to at least a first end face of the substrate, and the second internal electrode layers are exposed to at least a second end face of the substrate which is opposite to the first end face. A first external electrode layer is formed on the first end face and a third end face connecting the first end face and the second end face. The first external electrode layer is electrically connected to the first internal electrode layers. A second external electrode layer is formed on at least the second end face and the third end face. The second external electrode layer is electrically connected to the second internal electrode layers, and is electrically independent from the first external electrode layer. The first external electrode layer and the first internal electrode layers are to be divided by slits extending from the first end face to form a plurality of piezoelectric elements arrayed in a first direction. A part of the first external electrode layer and a part of the second external electrode layer are adjacent in the first direction on the third end face.

24 Claims, 22 Drawing Sheets

PIEZOELECTRIC ELEMENT FORMATION MEMBER INCORPORATED IN PIEZOELECTRIC ELEMENT FORMATION UNIT, PIEZOELECTRIC ACTUATOR UNIT AND LIQUID EJECTION HEAD

BACKGROUND OF THE INVENTION

The present invention relates to a piezoelectric element formation member in which piezoelectric elements deformed when a piezoelectric material layer is applied with a voltage are integrally formed; a piezoelectric element formation unit; a piezoelectric actuator unit; and a liquid injection head incorporating such a piezoelectric element formation member. In particular, the present invention relates to an ink jet recording head in which ink supplied to a pressure generating chamber being communicated with a nozzle orifice is pressurized by a piezoelectric element to allow the nozzle orifice to eject ink droplets.

As an ink jet recording head wherein a pressure generating chamber being communicated with a nozzle orifice for ejecting ink droplets is partially constructed by a vibration plate to allow this vibration plate to be deformed by a piezoelectric element so that ink in the pressure generating chamber is pressurized to eject ink droplets from the nozzle orifice. It is well known an ink jet recording head using a piezoelectric actuator of a longitudinal vibration mode which expands or contracts in the axial direction of the piezoelectric element.

For example, Japanese Patent Publication No. 2001-277525A (cf., FIGS. 2 and 3, pages 8–10) discloses Such a piezoelectric actuator unit comprising an actuator array in which a plurality of lamination type piezoelectric elements are arrayed and a fixation plate on which the actuator array is mounted. The actuator array is formed by alternately laminating a internal common electrode and an internal individual electrode while sandwiching a piezoelectric body therebetween. This actuator array has an external individual electrode and a external common electrode on surfaces thereof. The external individual electrode is connected to an internal individual electrode exposed to the distal end face of the actuator array. On the other hand, the external common electrode is connected to a internal common electrode exposed to a proximal end face of the actuator array. A contact is formed on each external individual electrode and each external common electrode. Connection terminals of a flexible cable is mounted on the contacts by soldering or the like.

However, in a piezoelectric actuator unit having such a structure, the external individual electrode and the external common electrode provided on the surface of each piezoelectric element are separated in a longitudinal direction thereof. Thus, the contact of the external individual electrode and the contact of the external common electrode, onto which the connection terminals of the flexible cable are mounted, are placed at different positions in the longitudinal direction of the piezoelectric element. In an actual case, the contacts of the external electrodes and the connection terminals of the flexible cable are isolated by providing an insulating layer such as a resist. Since it is difficult to accurately control the thickness of such an insulating layer, a defective connection would be occurred between the contacts and the connection terminals due to the error in the thickness of the insulating layer.

Besides, Japanese Patent Publication No. 2000-94677A (cf., FIGS. 1 to 4 and pages 3–4) discloses a structure in which slits are formed, by a wire saw, in a piezoelectric diaphragm formed with a conductive layer on a surface thereof, thereby dividing the conductive layer to form external individual electrodes and external common electrodes.

According to this structure, the flexible cable can be connected in a relatively favorable manner, but the manufacturing efficiency is low. That is, since the inspection for the connection failure between the external individual electrode and the external common electrode must be performed after the formation of the slits, not only the manufacturing efficiency is low but also the yield is low. This type of problem is also caused not only in an ink jet recording head for electing ink but also in a liquid injection head for ejecting liquid other than ink.

SUMMARY OF THE INVENTION

It is therefore an object of the invention to provide a piezoelectric element formation member which improves the manufacturing efficiency while realizing a downsized configuration.

It is also an object of the invention to provide a piezoelectric element formation unit, a piezoelectric actuator unit and a liquid ejection head incorporating such a piezoelectric element formation member.

In order to achieve the above objects, according to the invention, there is provided a piezoelectric element formation member, comprising:

a substrate, in which first internal electrode layers and second internal electrode layers are alternately laminated while sandwiching piezoelectric layers therebetween, the first internal electrode layers being exposed to at least a first end face of the substrate, and the second internal electrode layers being exposed to at least a second end face of the substrate which is opposite to the first end face;

a first external electrode layer formed on the first end face and a third end face connecting the first end face and the second end face, the first external electrode layer being electrically connected to the first internal electrode layers; and a second external electrode layer formed on at least the second end face and the third end face, the second external electrode layer being electrically connected to the second internal electrode layers, and being electrically independent from the first external electrode layer, wherein:

the first external electrode layer and the first internal electrode layers are to be divided by slits extending from the first end face to form a plurality of piezoelectric elements arrayed in a first direction; and a part of the first external electrode layer and a part of the second external electrode layer are adjacent in the first direction at a first region in the third end face.

In such a configuration, contacts, at which a drive wiring for supplying signals for driving the piezoelectric elements and the external electrode layers are electrically connected, can be arrayed straight in the first direction, thereby downsizing the piezoelectric element formation member.

Preferably, the second external electrode layer formed on the third end face is extend to the vicinity of the first end face.

In such a configuration, the area of the second external electrode layer to be an external common electrode is increased, so that the resistance of the external common electrode can be lowered. Accordingly, voltage drop during the driving of the piezoelectric elements can be avoided.

Here, it is further preferable that the second external electrode layer is extended to regions in the first end face which are in the vicinity of both side ends of the first end face, and the first external electrode layer formed on the first end face is situated between the regions.

In such a configuration, the area of the second external electrode layer can be further increased.

It is also preferable that a width of the second external electrode layer formed on the third end face and closer to the first end face is narrower than a width of the second external electrode layer formed on the third end face and closer to the second end face.

In such a configuration, an area of a mask member for forming the first and second external electrode layers can be increased. Since the mask member may have a sufficient stiffness, the external electrode layers can be formed with high accuracy.

Preferably, an end portion of the first external electrode layer formed on the third end face and closer to the second end face is narrowed.

In such a configuration, the area of the second external electrode layer to be an external common electrode is increased, so that the resistance of the external common electrode can be lowered. Accordingly, voltage drop during the driving of the piezoelectric elements can be avoided.

Preferably, the second external electrode layer is continuously extended from the second end face to the third end face.

In such a configuration, an acceptable second external electrode layer can be formed, thereby stabilizing the driving property of the piezoelectric elements.

Preferably, the second external electrode layer is continuously extended from the third end face to a fourth end face and a fifth end face respectively connecting the first end face, the second end face and the third end face.

In such a configuration, the second internal electrode layers and the second external electrode layer are electrically connected without fail. In addition, the resistance of the external common electrode can be further lowered, thereby stabilizing the driving property of the piezoelectric elements.

Preferably, a corner between the second end face and the third end face is chamfered.

In such a configuration, an acceptable second external electrode layer can be easily formed.

Preferably, a thickness of the second external electrode layer formed on the second end face is reduced toward a fourth end face which is opposite to the third end face.

In such a configuration, the material cost for the second external electrode layer can be reduced.

Preferably, the second external electrode layer is formed on the second end face except regions which are in the vicinity of both side ends thereof and extending in a second direction perpendicular to the third end face.

In such a configuration, the area of the second external electrode layer to be an external common electrode is increased, so that the resistance of the external common electrode can be lowered. Accordingly, voltage drop during the driving of the piezoelectric elements can be avoided.

Here, it is further preferable that a width of each of the regions is narrowed toward the third end face.

In such a configuration, a part of the second external electrode layer formed on the second end face and that formed on the third end face can be favorably connected.

Preferably, the second external electrode layer formed on the second end face is situated at least in the vicinity of both side ends thereof and extended in a second direction perpendicular to the third end face.

In such a configuration, the short-circuit between the first and second external electrode layers can be avoided. Further, the stiffness of the mask member for forming the external electrode layers can be enhanced.

Here, it is further preferable that the second external electrode layer is formed on the second end face except a region which is in the vicinity of a corner connecting the second end face and a fourth end face which is opposite to the third end face.

In such a configuration, the second internal electrode layers and the second external electrode layer are electrically connected without fail. In addition, the resistance of the external common electrode can be further lowered, thereby stabilizing the driving property of the piezoelectric elements.

It is also preferable that the second external electrode layer is formed entirely on the second end face.

In such a configuration, the second internal electrode layers and the second external electrode layer are electrically connected without fail. In addition, the resistance of the external common electrode can be further lowered, thereby stabilizing the driving property of the piezoelectric elements.

It is also preferable that the second external electrode layer is formed on the second end face except a region which is in the vicinity of a corner connecting the second end face and the third end face and opposing to the first external electrode layer.

In such a configuration, the resistance of the external common electrode can be further lowered, thereby stabilizing the driving property of the piezoelectric elements. Further, the stiffness of the mask member for forming the external electrode layers can be enhanced.

Preferably, the second external electrode layer formed on the second end face is partially thinned.

In such a configuration, the area of the second external electrode layer to be an external common electrode is increased, so that the resistance of the external common electrode can be lowered. Accordingly, voltage drop during the driving of the piezoelectric elements can be avoided.

According to the invention, there is also provided a piezoelectric element formation unit, wherein a fourth end face opposite to the third end face of the above piezoelectric element formation member is joined to a fixation board in a cantilevered manner, such that a portion of the piezoelectric element formation member closer to the first end face becomes a free end face.

In such a configuration, inspections for the insulating failure between the first and second external electrode layers or the like can be executed before forming the slits. Accordingly, the manufacturing efficiency and yield can be improved.

According to the invention, there is also provided a piezoelectric actuator unit, wherein at least a portion of the piezoelectric element formation member which is cantilevered by the above fixation board is pectinated by the slits.

Preferably, the slits are extended to at least an end of the first external electrode layer formed on the third end face and closer to the second end face.

In such a configuration, the piezoelectric elements can be formed readily and favorably.

According to the invention, there is also provided a liquid ejection head, comprising:

the above piezoelectric actuator unit;

a drive wiring, comprising a plurality of drive electrodes electrically connected, through contacts, to the divided ones of the first external electrode layer and the second external electrode layer, to supply signals for driving the piezoelectric elements; and a vibration plate, which forms a part of each of pressure generating chambers communicated with a nozzle orifice from which an ink droplet is ejected, wherein the second end face of the substrate is abutted against the vibration plate such that distal ends of the piezoelectric elements are associated with the respective pressure generating chambers.

Preferably, the contacts are arrayed in the first direction at the first region.

In such a configuration, the downsized liquid ejection head can be obtained.

BRIEF DESCRIPTION OF THE DRAWINGS

The above objects and advantages of the present invention will become more apparent by describing in detail preferred exemplary embodiments thereof with reference to the accompanying drawings, wherein:

FIGS. 5A through 8B are section views showing how to manufacture the piezoelectric element formation member of FIG. 4;

FIG. 7 is a perspective view of a piezoelectric element formation unit for the piezoelectric actuator unit of FIG. 1;

FIG. 8B is a section view taken along a line VIIIB—VIIIB in FIG. 8A;

DETAILED DESCRIPTION OF THE INVENTION

Preferred embodiments of the invention will be described below in detail with reference to the accompanying drawings.

Figure 1:
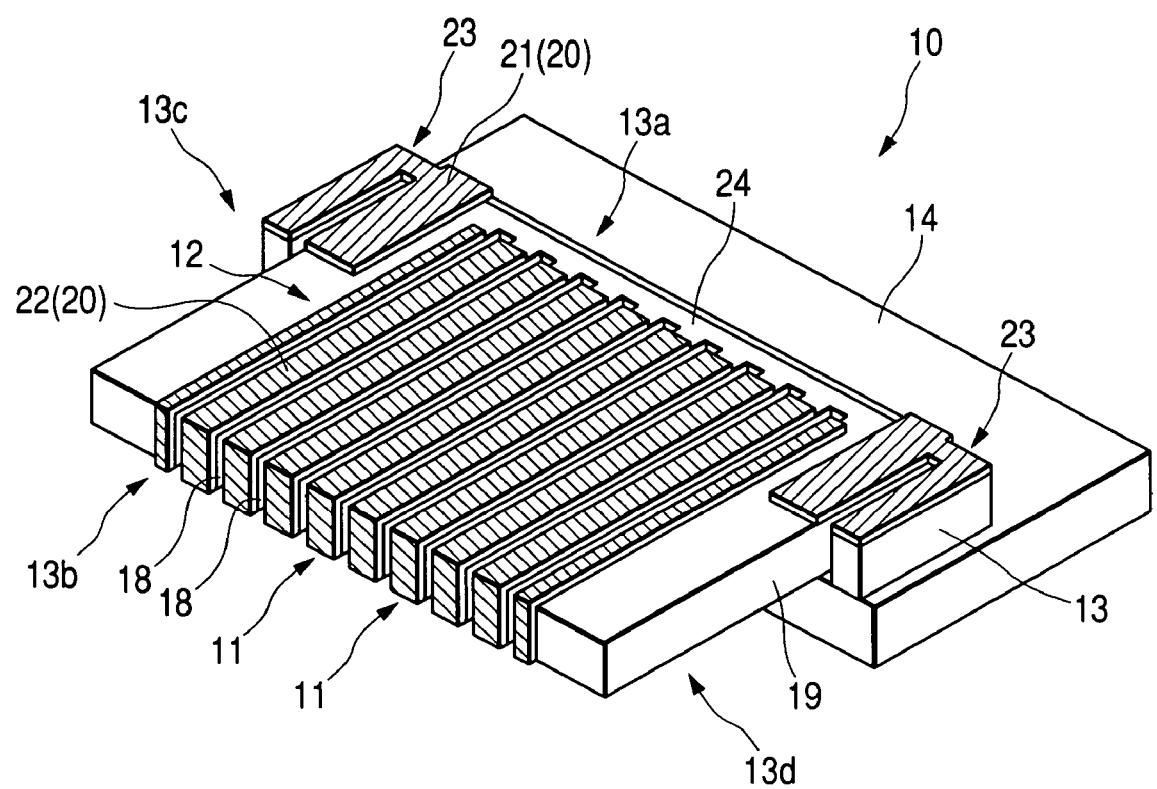
FIG. 1 is a perspective view of a piezoelectric actuator unit according to a first embodiment of the invention.
Figure 2A:
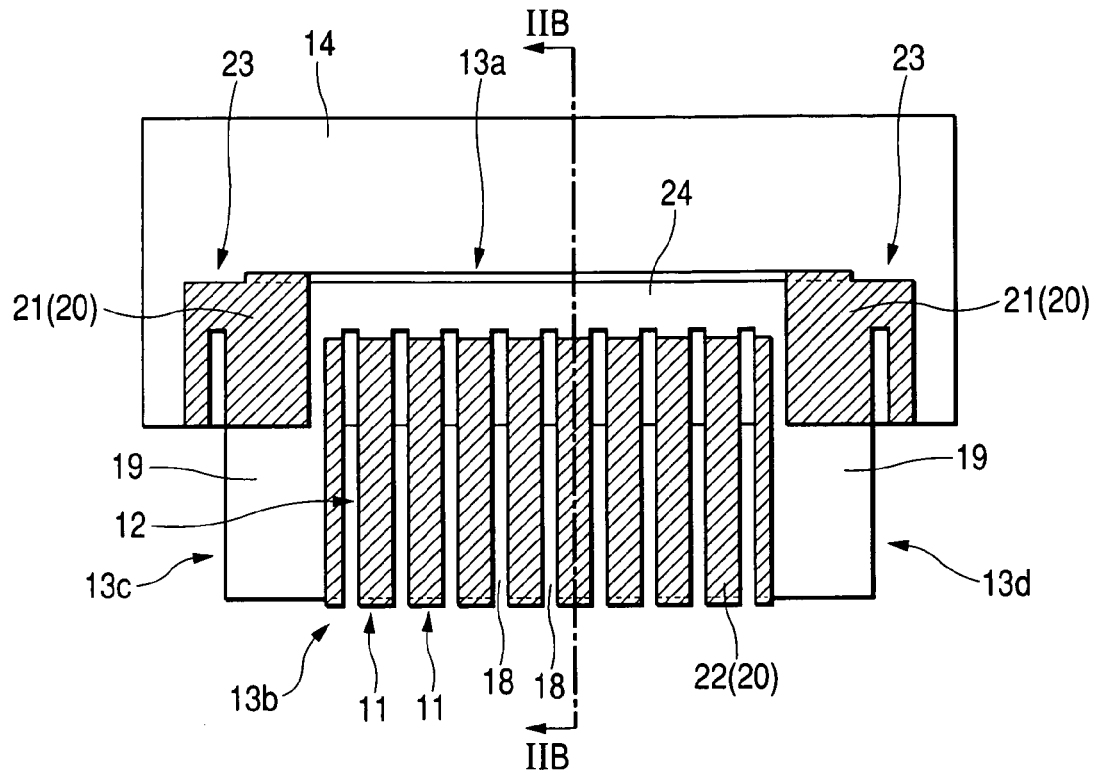
FIG. 2A is a plan view of the piezoelectric actuator unit of FIG. 1.

As shown in FIGS. 1 and 2, a piezoelectric actuator unit 10 according to a first embodiment comprises: a piezoelectric element formation member 13 in which a plurality of piezoelectric elements 11 are arrayed to form a row 12; and a fixation board 14 on which the proximal end section of the piezoelectric element formation member 13 is joined in a cantilevered manner, so that the distal end section thereof becomes a free end. The piezoelectric actuator unit 10 is installed in an ink jet recording head, for example.

The piezoelectric element formation member 13 is formed by alternately laminating internal individual electrodes 16 and internal common electrodes 17, which are to be two poles of the piezoelectric element 11, while sandwiching piezoelectric material layers 15 therebetween. The internal individual electrode 16 in one of the piezoelectric elements 11 is made discrete electrically from that in another one of the piezoelectric element 11. The internal common electrode 17 in one of the piezoelectric elements 11 is made common electrically to that in another one of the piezoelectric element 11.

A plurality of slits 18 are formed in the distal end side of the piezoelectric element formation member 13 by a wire saw or the like, to form the row 12 of the pectinated piezoelectric elements 11. Both sides of the arrayed piezoelectric elements 11, there are provided positioning members 19 having a wider width than that of each piezoelectric element 11. The positioning member 19 serves to accurately place the piezoelectric actuator unit 10 at a predetermined position when the piezoelectric actuator unit 10 is installed in the ink jet recording head.

Figure 2B:
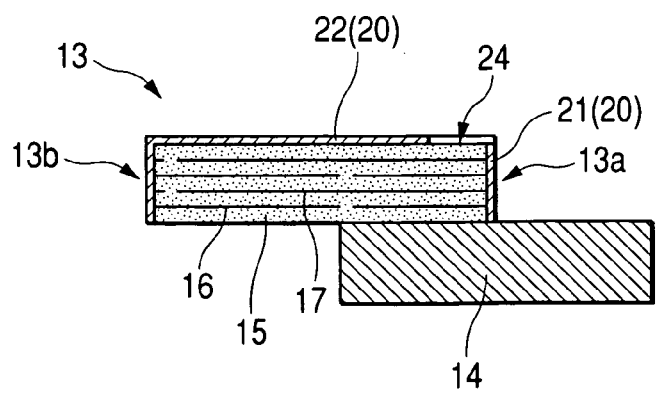
FIG. 2B is a section view taken along a line IIB—IIB in FIG. 2A.

As shown in FIG. 2B, each of the internal individual electrodes 16 is extended entirely in the longitudinal direction of the piezoelectric electrode 11 while being separated at a position where is in the vicinity of a front end face of the fixation board 14. Similarly, each of the internal common electrodes 17 is extended entirely in the longitudinal direction of the piezoelectric electrode 11 while being separated at a position where is in the vicinity of the distal end of the piezoelectric element 11. Accordingly, a region of the piezoelectric element 11 which is joined to the fixation board 14 becomes a non-active region which does not contribute to the actuating operation. When the voltage is applied between the internal individual electrodes 16 and the internal common electrodes 17, it is deformed only a region of the piezoelectric element 11 (the distal end side) which is not joined to the fixation board 14.

An external electrode 20 is formed on the outer faces of the piezoelectric element formation member 13. Specifically, the external electrode 20 includes an external common electrode 21 connected to the internal common electrodes 17, and external individual electrodes 22 connected to the internal individual electrodes 16. The external common electrode 21 and the external individual electrodes 22 are provided while being electrically individual.

The external common electrode 21 is provided on a proximal end face 13a of the piezoelectric element formation member 13 while forming no-electrode regions 23 in the vicinity of both widthwise ends of the proximal end face 13a. The external common electrode 21 is electrically connected to the internal common electrodes 17 which are exposed to the proximal end face 13a. Each of the no-electrode regions 23 extends entirely in the thickness direction of the piezoelectric element formation member 13. The external common electrode 21 continuously extends to regions on a top face of the piezoelectric element formation member 13 in the vicinity of both proximal side corners thereof. The width of each no-electrode region 23 is made smaller than the width of the part of the external common electrode 21 on the top face of the piezoelectric element formation member 13. The external common electrode 21 may be formed on the proximal end face 13a entirely.

Each of the external individual electrodes 22 is extended from a distal end face 13b of the piezoelectric element formation member 13 to a region on the top face of thereof in the vicinity of where is the external common electrode 21 is provided. At a proximal end section of the top face of the piezoelectric element formation member 13, a no-electrode region 24 is defined by the external common electrode 21 and the external individual electrodes 22.

Figure 3:
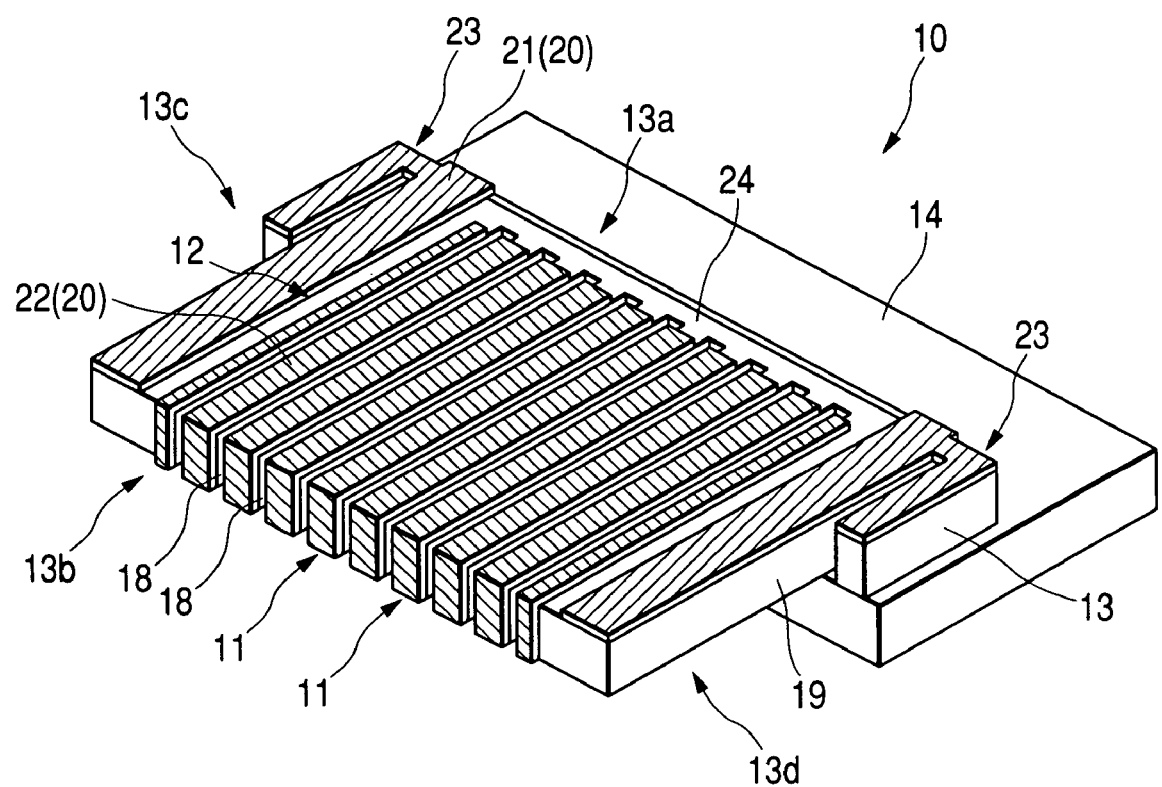
FIG. 3 is a perspective view of a first modified example of the piezoelectric actuator unit of FIG. 1.

In this embodiment, the no-electrode region 24 extends to a distal end section of each positioning member 19. However, as shown in FIG. 3, the external common electrode 21 on the top face of the piezoelectric element formation member 13 may be extended to the distal end section of the positioning member 19.

The piezoelectric actuator unit 10 is manufactured by forming slits 18 from the distal end side of the piezoelectric element formation member 13, so as to extend to the no-electrode region 24. In this configuration, the external individual electrodes 22 are arrayed on the top face of the piezoelectric element formation member 13, and the external common electrode 21 is arranged at both sides of the arrayed external individual electrodes 22. Accordingly, a contact section with respect to wirings for supplying drive signals to the respective piezoelectric elements 11 can be formed in a relatively narrow region, thereby downsizing the piezoelectric actuator unit 10.

Next, a method for forming such a piezoelectric actuator unit 10 will be described.

Figure 4:
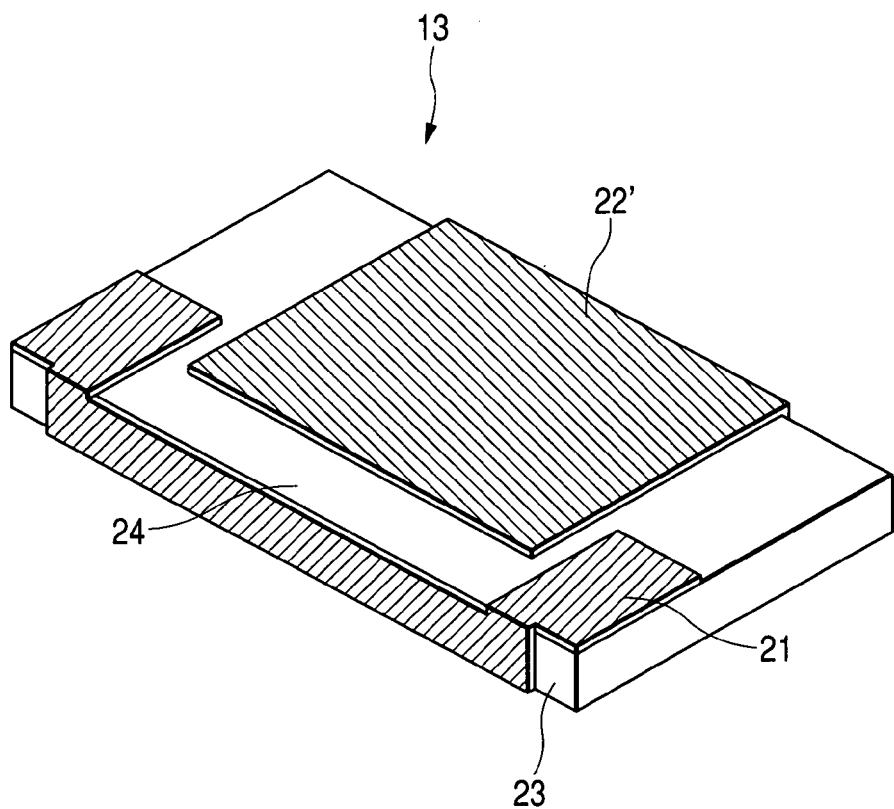
FIG. 4 is a perspective view of a piezoelectric element formation member for the piezoelectric actuator unit of FIG. 1.

First, as shown in FIG. 4, there is formed the piezoelectric element formation member 13 in which the external common electrode 21 and a conductive layer 22' which is to be divided later to form the external individual electrodes 22 are provided on the outer faces thereof.

Figure 5A:
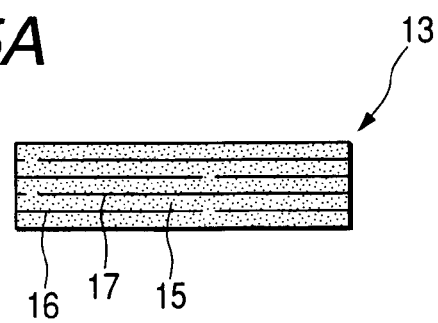

Specifically, as shown in FIG. 5A, the internal individual electrodes 16 and the internal common electrodes 17 are alternately laminated while sandwiching the piezoelectric material layers 15 made of titanic acid lead zirconate (PZT), for example.

Figure 5B:
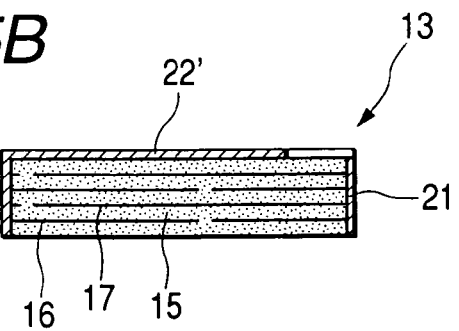
Figure 6A:
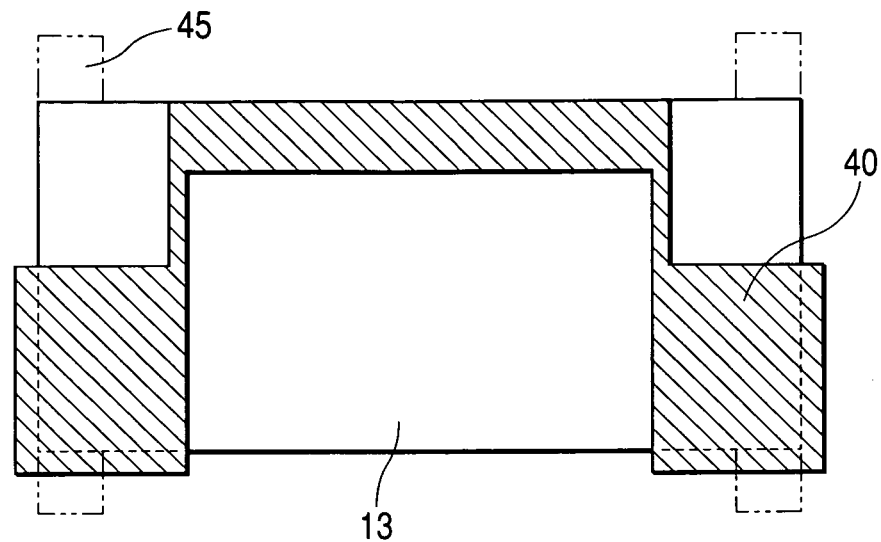
Figure 6B:
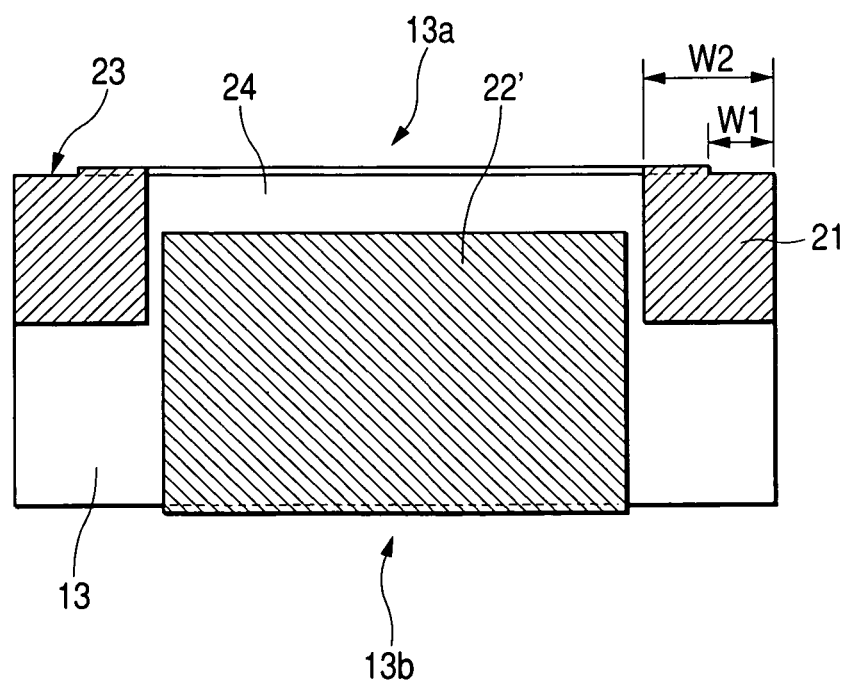

Next, as shown in FIG. 5B, the external common electrode 21 and the conductive layer 22' are formed on the outer faces of the piezoelectric element formation member 13. Specifically, as shown in FIG. 6A, a mask member 40 having a predetermined shape and made of, for example, stainless steel (SUS) is placed on the piezoelectric element formation member 13, and a metal material such as chrome (Cr), nickel (Ni), copper (Cu), gold (Au) is deposited or sputtered thereon. Accordingly, as shown in FIG. 6B, the external common electrode 21 and the conductive layer 22' having predetermined geometries are formed.

During the formation of the external electrodes, the piezoelectric element formation member 13 is retained in a holder (not shown). Incidentally, retaining projections 45 of the holder shown in FIG. 6A are abutted against the parts of the proximal end face 13a to be the no-electrode regions 23. The width W1 of each no-electrode region 23 not preferably equal to a half or less of the width W2 of the part of the external common electrode 21 provided on the top face of the piezoelectric element formation member 13. In such a configuration, the sufficient area of the external common electrode 21 can be secured, so that a resistance thereof can be lowered even in a case where the thickness of the external common electrode 21 is thin.

The mask member 40 defines the no-electrode region 24 which makes the external common electrode 21 and the conductive layer 22' individual physically and electrically.

Figure 10A:
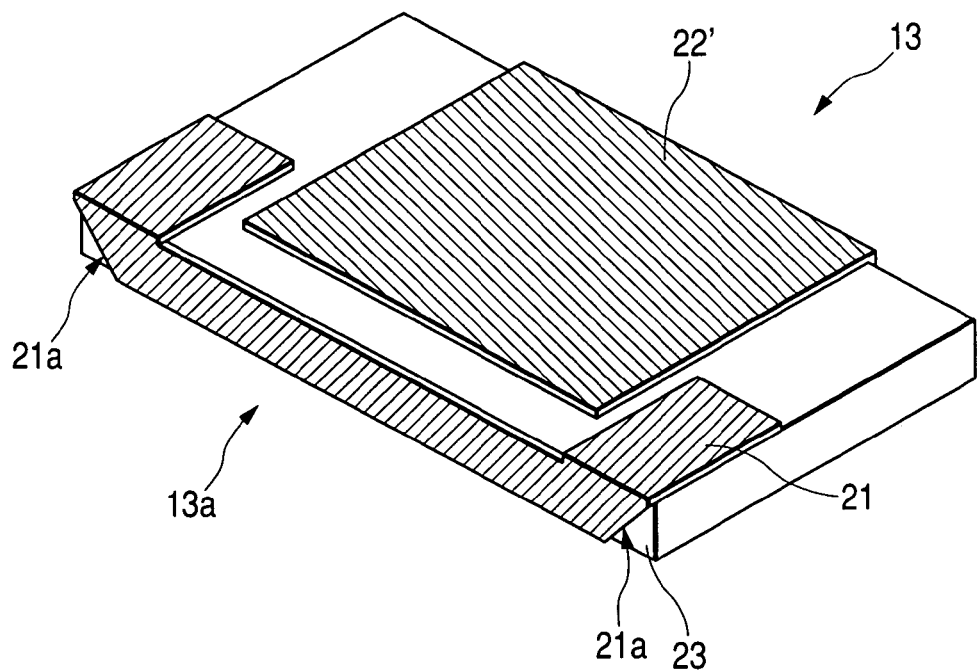
FIG. 10A is a perspective view of a piezoelectric element formation member for a second modified example of the piezoelectric actuator unit of FIG. 1.
Figure 10B:
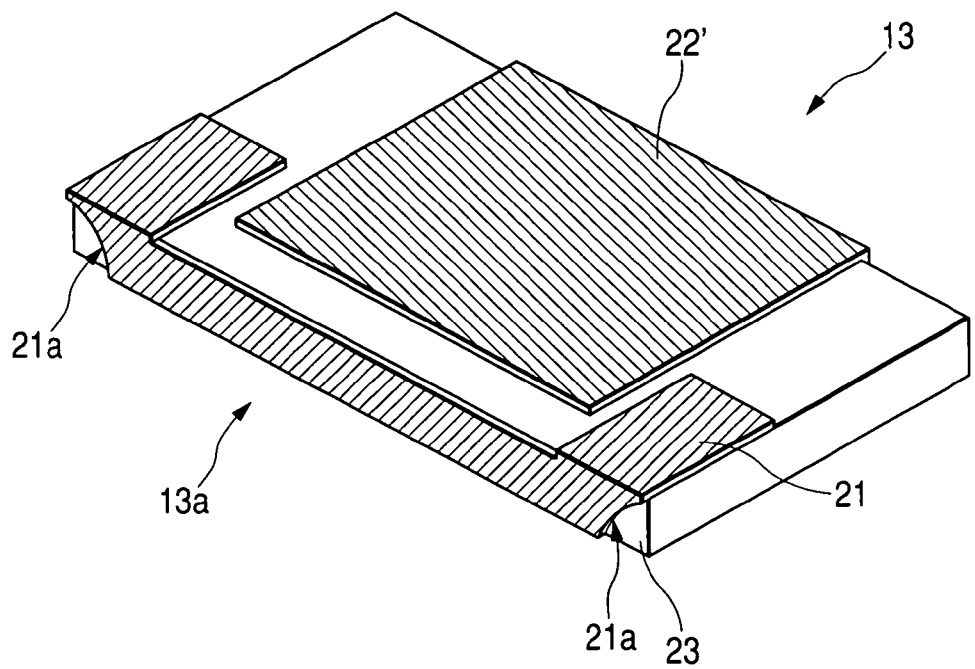
FIG. 10B is a perspective view of a piezoelectric element formation member for a third modified example of the piezoelectric actuator unit of FIG. 1.

In this embodiment, each no-electrode region 23 has an identical width entirely in the thickness direction of the piezoelectric element formation member 13. However, the width may be decreased toward the top face of the piezoelectric element formation member 13. For instance, as shown in FIG. 10A, the width of the no-electrode region 23 is linearly decreased. Alternately, as shown in FIG. 10B, the boundary between the external common electrode 21 and the no-electrode region 23 may be curved.

In such configurations, the width of the external common electrode 21 at the corner between the top face and the proximal end face 13a of the piezoelectric element formation member 13 can be increased while securing the area for supporting the piezoelectric element formation member 13 by the retaining projections 45. Accordingly, the external common electrode 21 can be accurately formed while preventing the connection failure due to the breakage of the external common electrode 21. Further, the sufficient area of the external common electrode 21 can be secured, so that a resistance thereof can be lowered even in a case where the thickness of the external common electrode 21 is thin.

Figure 11A:
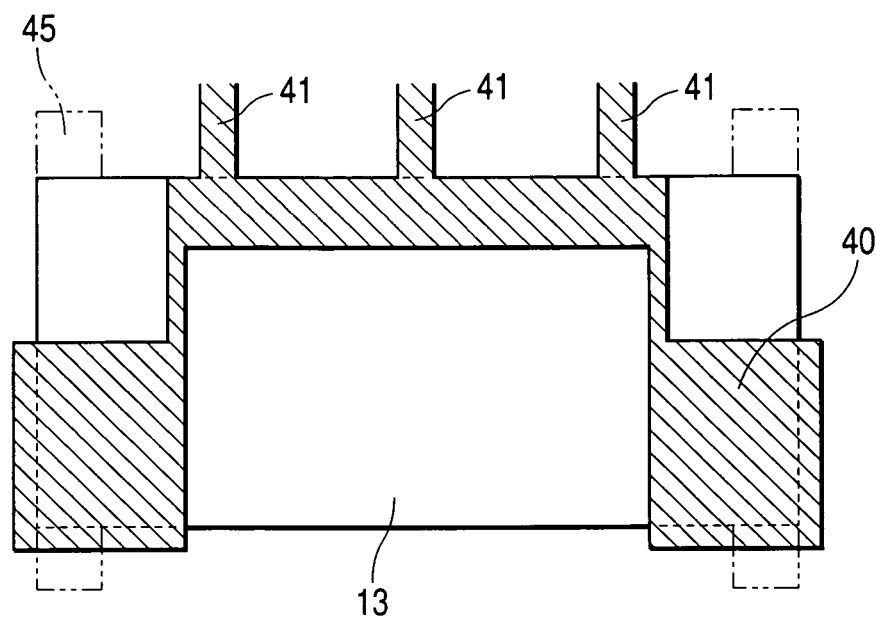
FIGS. 11A and 11B are plan views showing how to manufacture a piezoelectric element formation member for a fourth modified example of the piezoelectric actuator unit of FIG. 1.
Figure 11B:
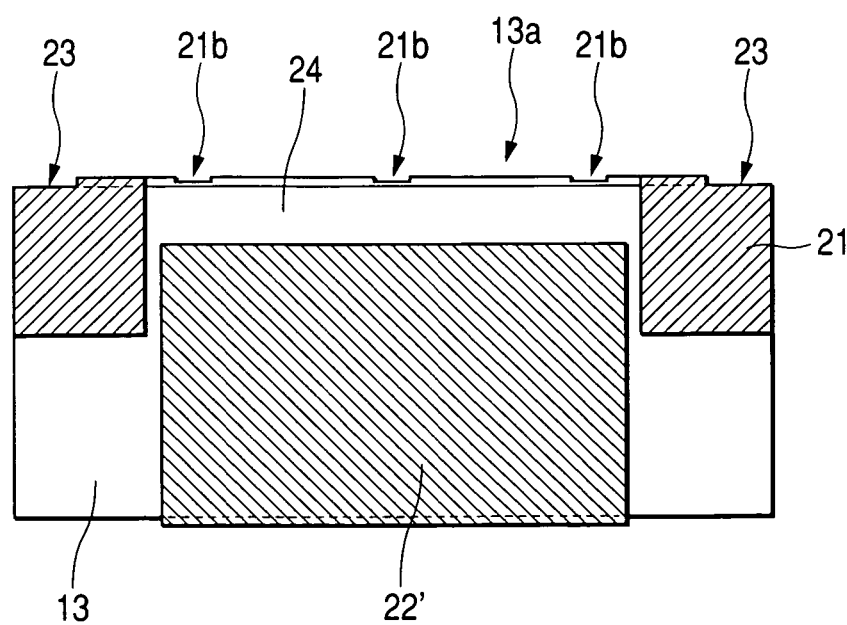

The shape of the mask member 40 may be changed. For example, as shown in FIG. 11A, a plurality of ribs 41 for supporting the mask member 40 may be formed at one end thereof facing the proximal end of the piezoelectric element formation member 13. In such a configuration, the mask member 40 can be accurately placed at a predetermined position during the formation of the external electrodes. Accordingly, the external common electrode 21 and the conductive layer 22' can be formed with high accuracy.

However, in this case, parts 21b of the external common electrode 21 corresponding to the ribs 41 is thinned. In accordance with the fabricating condition, the parts 21b may be no-electrode regions. Since the area of the external common electrode 21 is preferable large to lower the resistance of the internal common electrodes 17 to stabilize the driving of the piezoelectric elements 11, the width of each rib 41 is preferably narrowed. The number of the ribs 41 is preferably few if the mask member 40 can be supported.

Figure 12A:
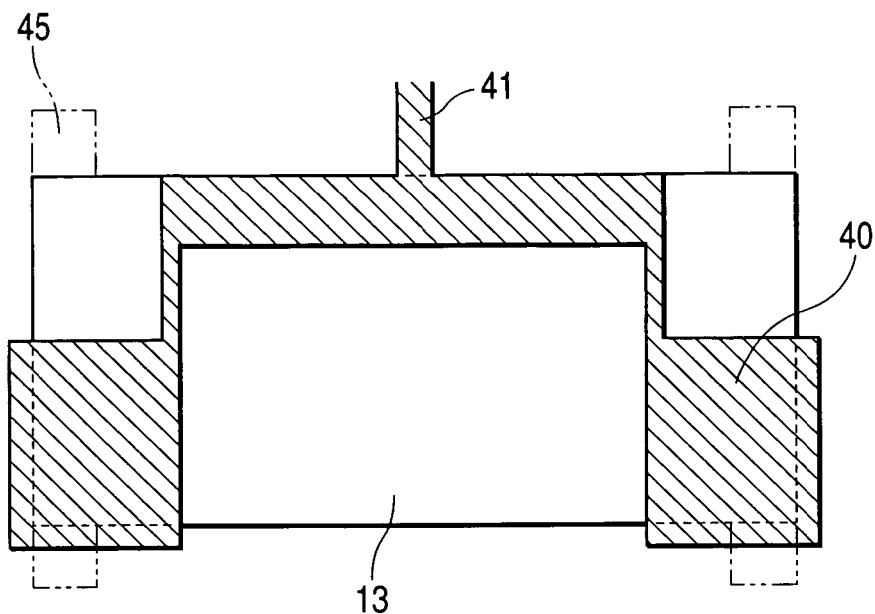
FIGS. 12A and 12B are plan views showing how to manufacture a piezoelectric element formation member for a fifth modified example of the piezoelectric actuator unit of FIG. 1.
Figure 12B:
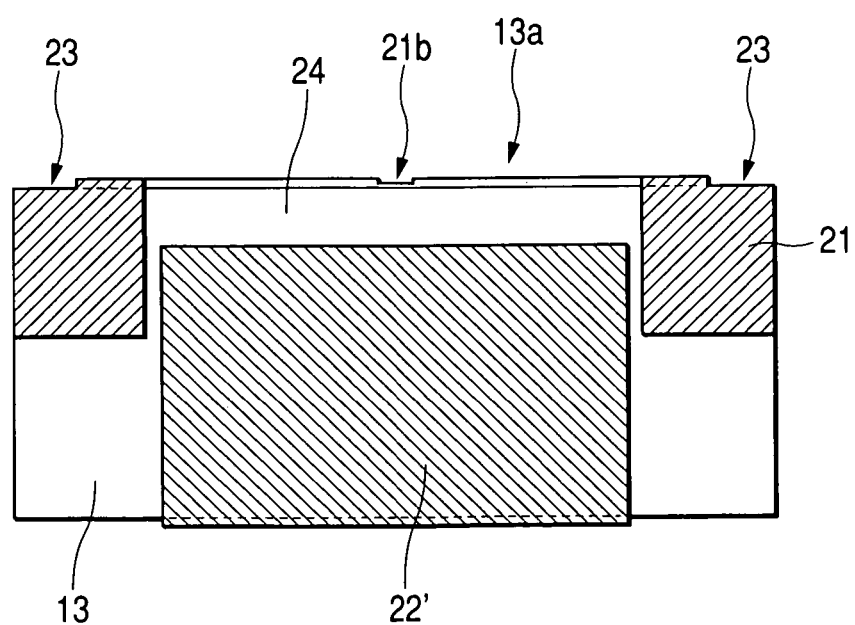

In view of the above, as shown in FIG. 12A, only one rib 41 is preferably formed at the widthwise center of the mask member 40. In this case, the thinned part 21b is formed only the widthwise center of the external common electrode 21 provided on the proximal end face 13a. In such a configuration, the voltage applied to the arrayed piezoelectric elements 11 is not varied in accordance with the position in the row 12, thereby driving the respective piezoelectric elements 11 uniformly.

Figure 7:
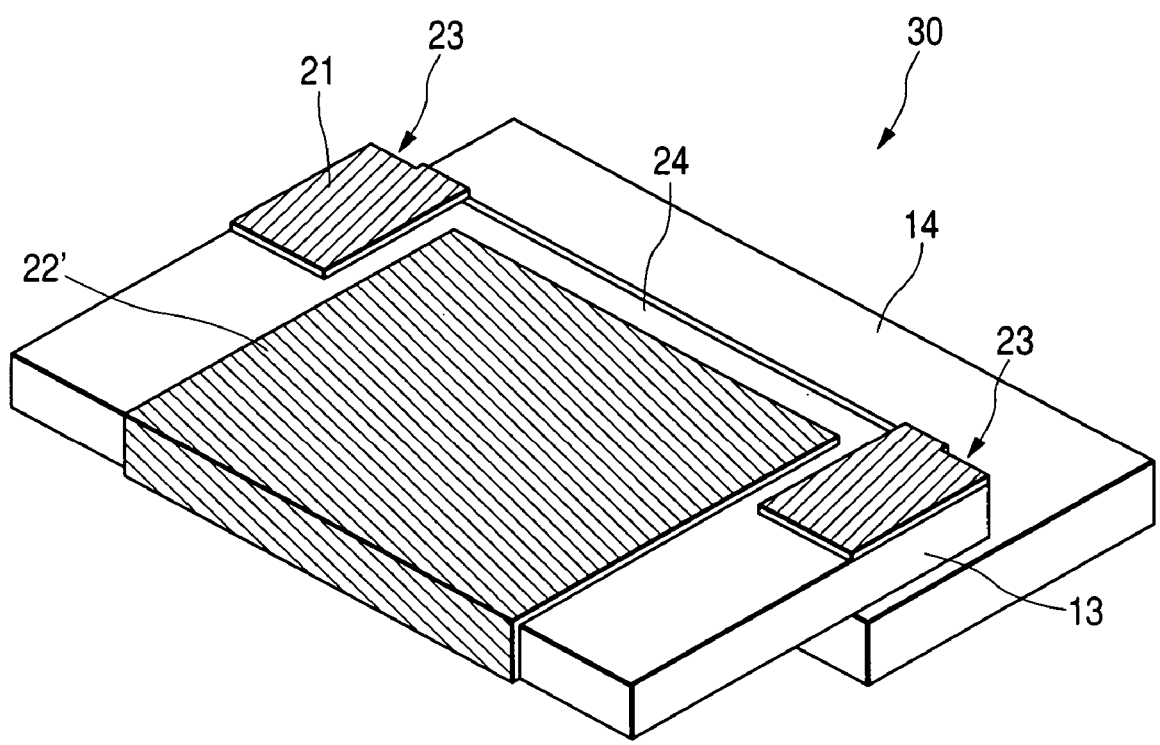

After the formation of the external common electrode 21 and the conductive layer 22', as shown in FIG. 7, the fixation board 14 is joined to a bottom face in the distal end section of the piezoelectric element formation member 13 to form a piezoelectric element formation unit 30. The fixation board may be made hard material having a large gravity such as stainless steel (SUS) or tungsten alloy.

In the piezoelectric element formation unit 30, since the external common electrode 21 and the conductive layer 22' are made individual electrically, the inspections for the insulation failure therebetween and the electrostatic capacitance or the like can be executed at this stage. In other words, such inspections can be executed before dividing the conductive layer 22' into the external individual electrodes 22. Accordingly, the inspection process can be simplified, thereby improving the inspection efficiency. Further, since the piezoelectric actuator unit 10 can be manufactured from the acceptable piezoelectric element formation unit 30 which has passed the inspection, the yield can be improved.

In this embodiment, the inspection is executed after assembling the piezoelectric element formation unit 30. However, the inspection may be performed before the piezoelectric element formation member 13 is joined to the fixation board 14.

Figure 8A:
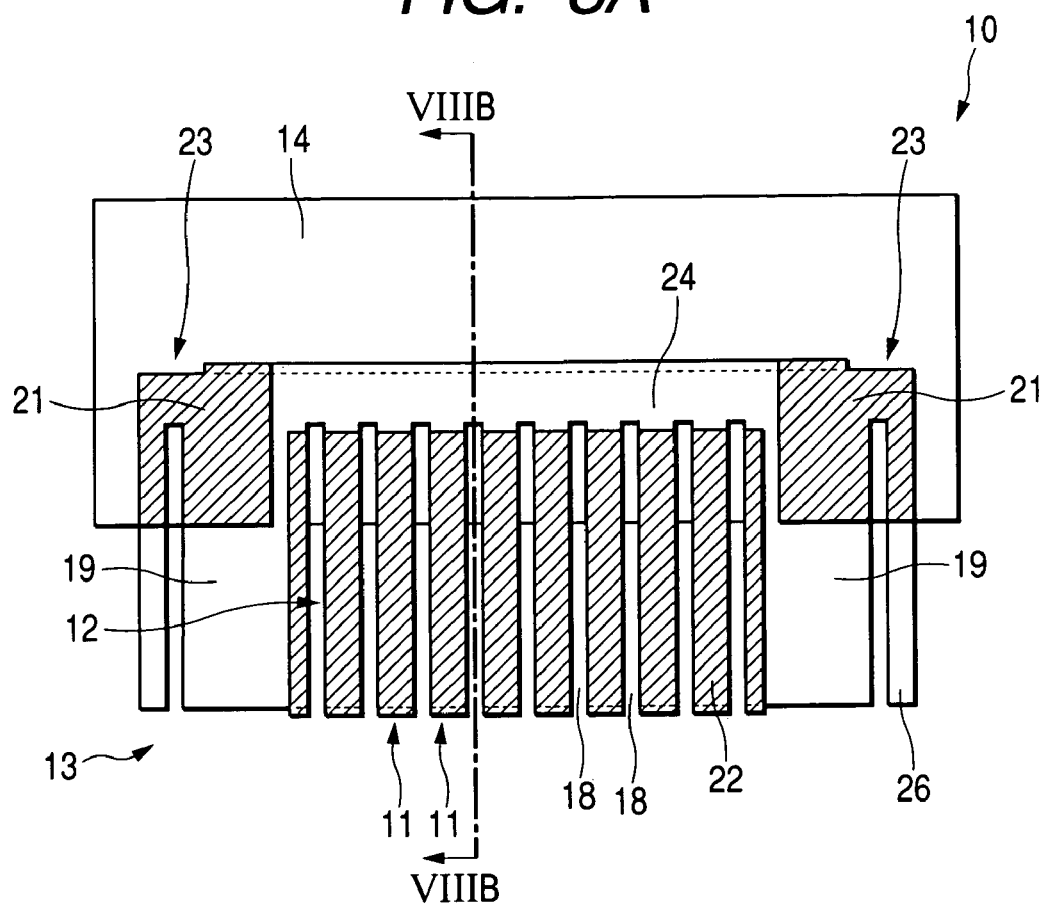
FIG. 8A is a plan view showing manufacture the piezoelectric actuator unit of FIG. 1.
Figure 8B:
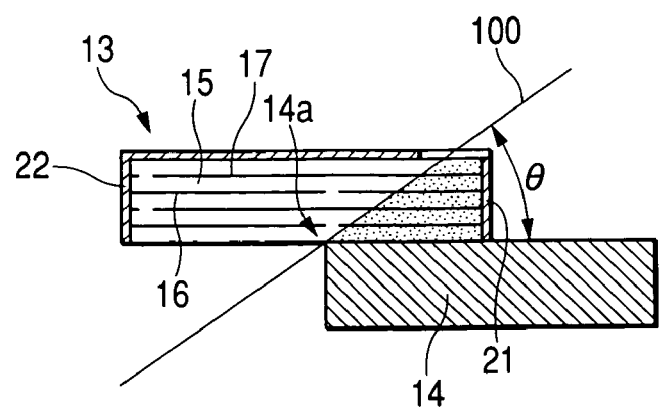

Thereafter, the acceptable piezoelectric element formation unit 30 having passed the inspection is pectinated to form the piezoelectric actuator unit 10. As shown in FIGS. 8A and 8B, a plurality of wire saws 100 are applied from the distal end section of the piezoelectric element formation member 13 to simultaneously form the slits 18. Specifically, each of the wire saws 100 is brought into contact with the distal end section of the piezoelectric element formation member 13 at a predetermined angle θ to begin the cutting. The cutting is continued until a corner 14a of the fixation board 14 is slightly cut, thereby forming the row 12 of the piezoelectric elements 11 and the positioning members 19. Projections 26 remained at a widthwise outer side of each positioning member 19 is cut to be removed later. Since the wire saws 100 are angled from the top face of the piezoelectric element formation member 13, the internal individual electrodes 16 and the external individual electrodes 22 are formed without fail, while the fixation board 14 is not substantially subjected to the cutting.

The slits 18 are formed so as to reach the no-electrode region 24 formed in the top face of the piezoelectric element formation member 13, thereby making the external individual electrodes 22 independent for the respective piezoelectric elements 11.

In this embodiment, the slits 18 do not reach the proximal end face 13a of the piezoelectric element formation member 13. However, the slits may reach the proximal end face 13a. In this case, since the external common electrode 21 is formed on the proximal end face 13a (except the no-electrode regions 23), even when a part of the internal common electrodes 17 exposed to the proximal end face 13a is completely divided by the slits 18, the electric conduction there among can be secured by the external common electrode 21 formed on the proximal end face 13a.

Figure 13:
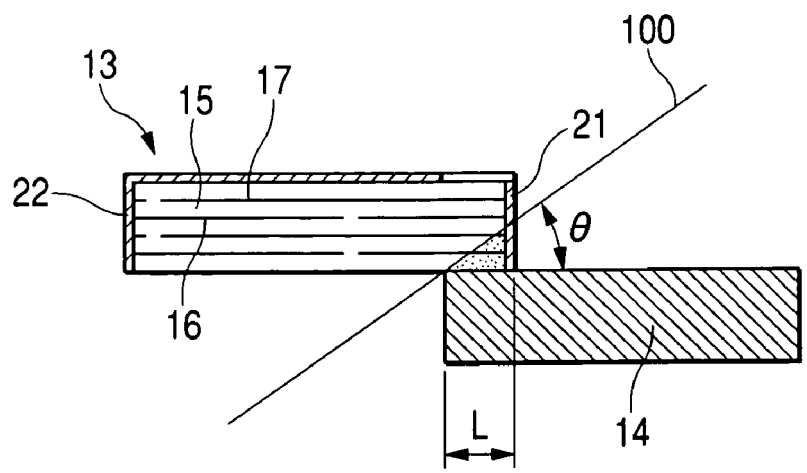
FIG. 13 is a section view showing how to manufacture a sixth modified example of the piezoelectric actuator unit of FIG. 1.

By forming the external common electrode 21 on the proximal end face 13a at least a part where the arrayed piezoelectric elements 11 are formed, the piezoelectric actuator unit 10 can be downsized. Specifically, as shown in FIG. 13, the dimension L of the part of the fixation board 14 on which the piezoelectric element formation member 13 is mounted can be reduced.

In this embodiment, since the conductive layer 22' is formed on a region which is slight wider than the region where the arrayed piezoelectric elements 11 are formed, the external individual electrodes 22 are formed also on the positioning members 19. Accordingly, the external individual electrodes 22 can be surely provided for the respective piezoelectric elements 11 while allowing slight errors in the formation of the slits 18.

Figure 14:
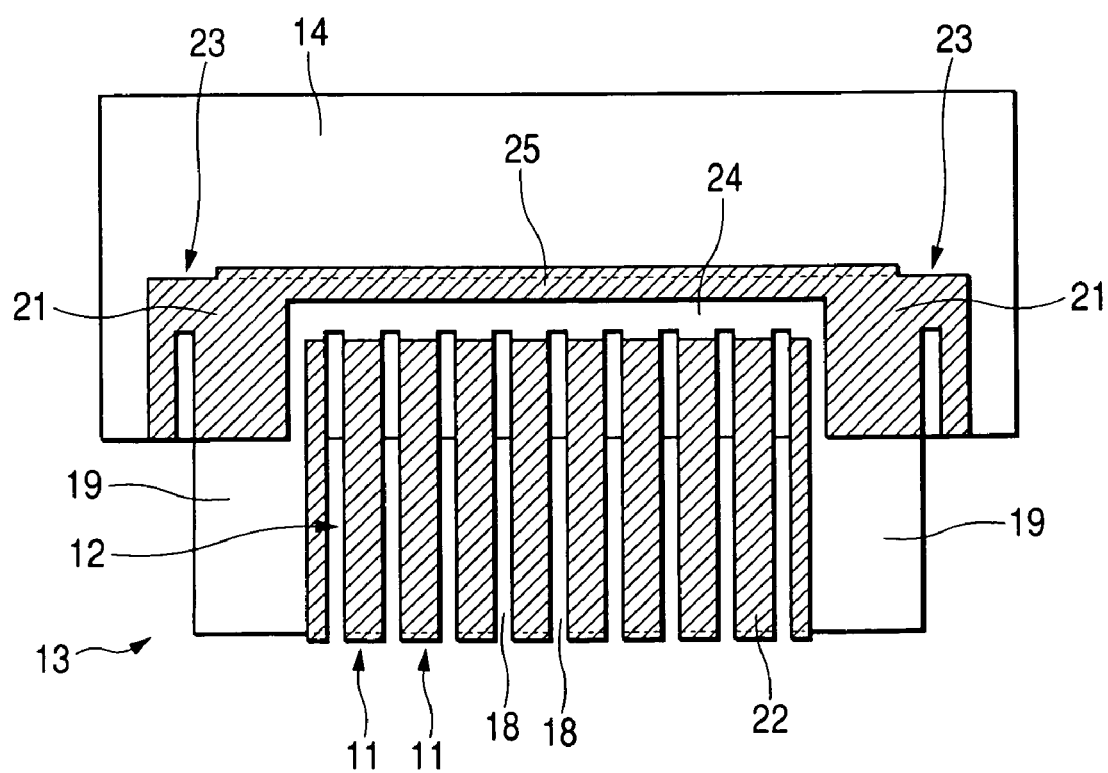
FIG. 14 is a plan view of a seventh modified example of the piezoelectric actuator unit of FIG. 1.

In this embodiment, the proximal end of the top face of the piezoelectric element formation member 13 is almost formed as the no-electrode region 24. However, the external common electrode 21 may be entirely formed on the proximal end of the top face as designated by the numeral 25 in FIG. 14.

Figure 15A:
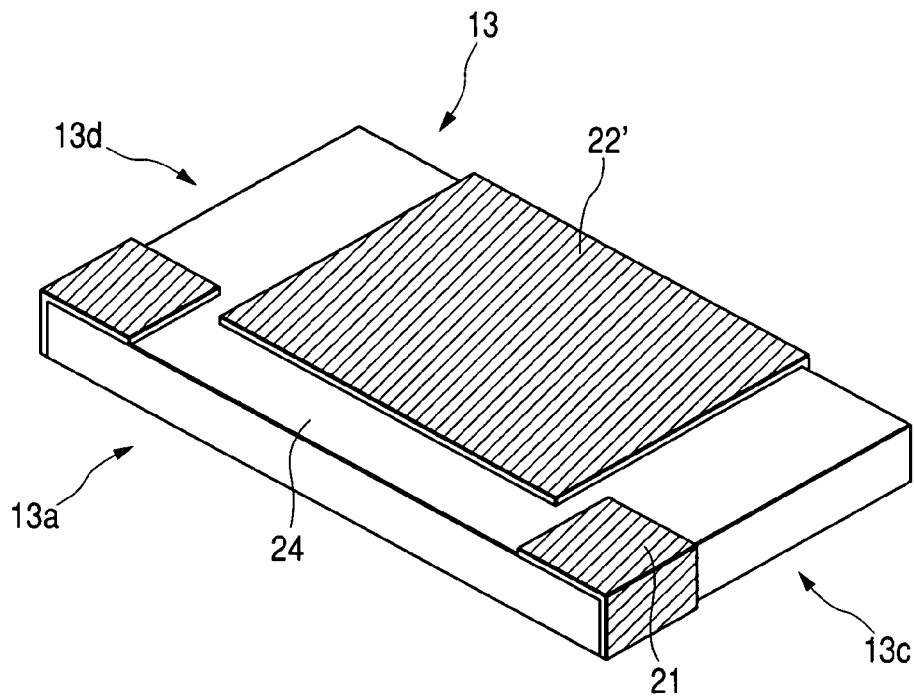
FIG. 15A is a perspective view of a piezoelectric element formation member for an eighth modified example of the piezoelectric actuator unit of FIG. 1.
Figure 15B:
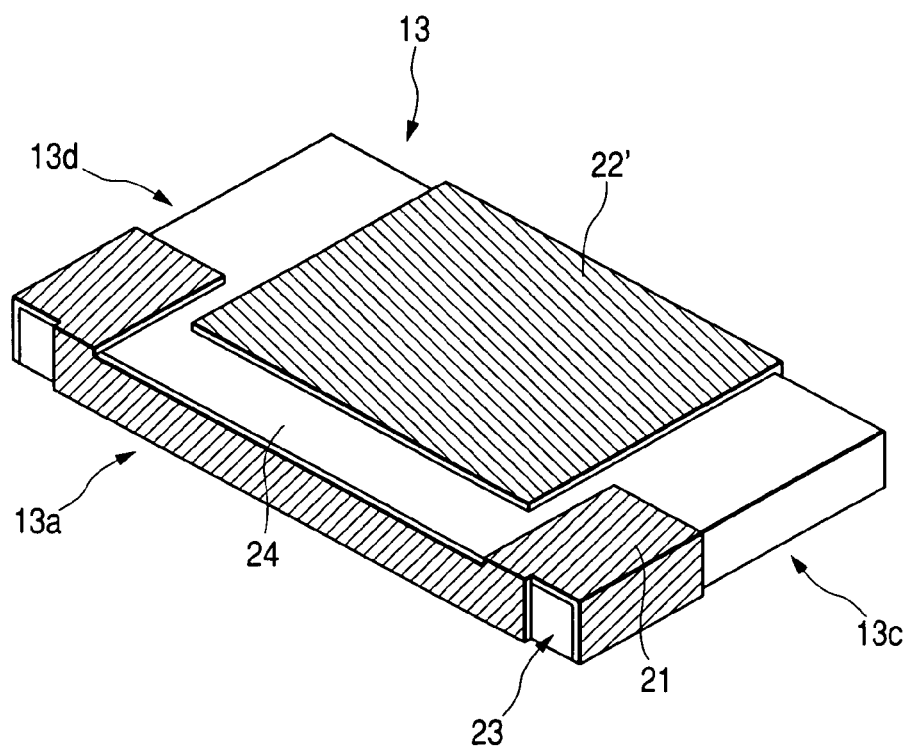
FIG. 15B is a perspective view of a piezoelectric element formation member for a ninth modified example of the piezoelectric actuator unit of FIG. 1.

In this embodiment, the external common electrode 21 is electrically connected with the internal common electrodes 17 at the proximal end face 13a of the piezoelectric element formation member 13. However, as shown in FIG. 15A, a plurality of external common electrodes 21 may be formed so as to extend from the top face to side faces 13c, 13d of the piezoelectric element formation member 13, so that the internal common electrodes 17 are electrically connected at the side faces 13c, 13d Further, as shown in FIG. 15B, the external common electrode 21 may be continuously extended from the top face to the proximal end face 13a and the side faces 13c, 13d.

Figure 9A:
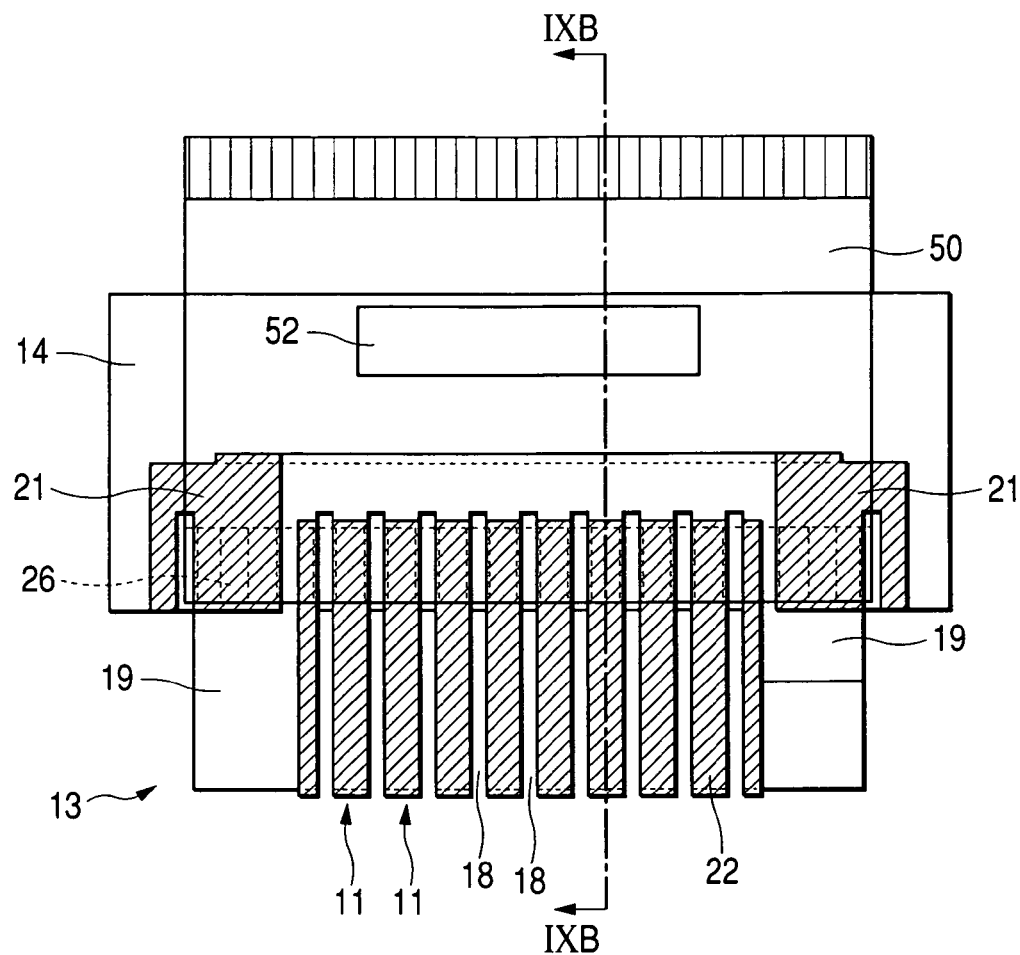
FIG. 9A is a plan view showing manufacture the piezoelectric actuator unit of FIG. 1.

Thereafter, as shown in FIG. 9, a drive wiring 50 having a plurality of drive electrodes 51 for supplying drive signals to the respective piezoelectric elements 11 is connected to the thus-configured piezoelectric actuator unit 10. Specifically, the drive wiring 50 such as a TAB (tape automated bonding) tape in which a drive IC 52 is mounted on the drive electrodes 51 is connected with contacts 26 of the external common electrode 21 and the external individual electrodes 22, by soldering, anisotropic conductive agent, for example.

As described the above, the external individual electrodes 22 are extended to a region where the external common electrode 21 is formed on the top face of the piezoelectric element formation member 13. In other words, the external common electrode 21 is arranged in both outer sides of the arrayed external individual electrodes 22. In such a configuration, the contacts 26 are arrayed straight, thereby reducing the area used to be connected with the drive electrodes 51 to downsize the piezoelectric actuator unit 10.

In such a case, the drive electrodes 51 are connected to the contacts 26 irrespective of the thickness of an insulating layer 53 which partly covers the drive electrodes 51, thereby enhancing reliability. Further, the manufacturing efficiency can be improved, thereby reducing costs.

Figure 16A:
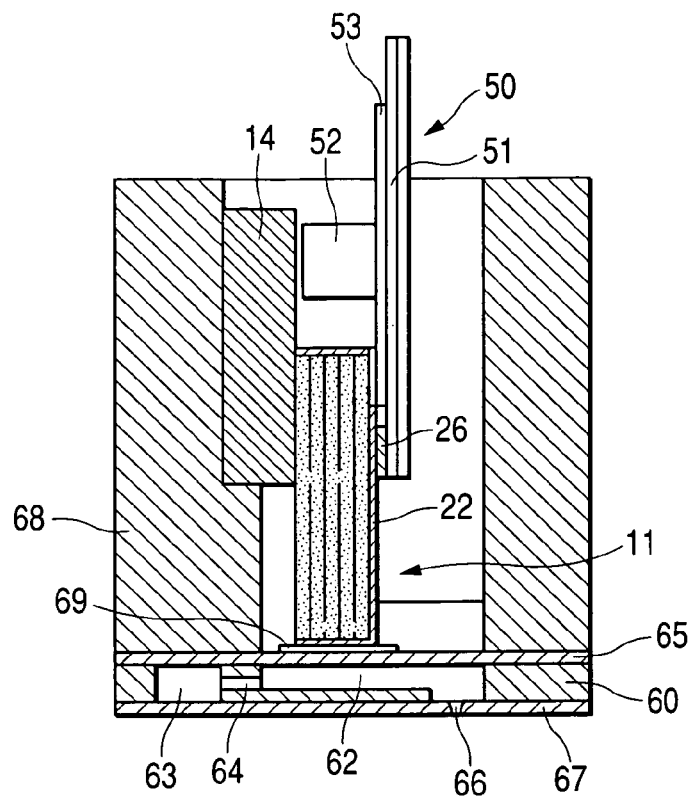
FIG. 16A a section view of a liquid ejection head incorporating the piezoelectric actuator unit of FIG. 1.
Figure 16B:
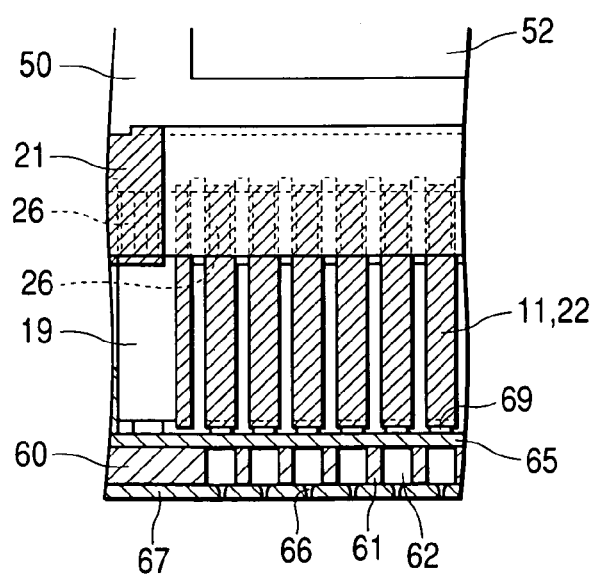
FIG. 16B is a section view showing an essential part of the liquid ejection head of FIG. 16A.

Thereafter, as shown in FIGS. 16A and 16B, the piezoelectric actuator unit 10 is installed in an ink jet recording head comprising a channel formation substrate 60 made of a monocrystalline silicon substrate. The channel formation substrate 60 is formed with a plurality of arrayed pressure generating chambers 62 defined by a plurality of partition walls 61. A reservoir 63 is communicated with one longitudinal end of each pressure generating chamber 62 via a ink supply port 64 for supplying ink to the respective pressure generating chambers 62. A vibration plate 65 is joined to an upper face of the channel formation substrate 60 by adhesive agent, a thermal welding film or the like, to seal the pressure generating chambers 62 opened thereat. A nozzle plate 67 formed with nozzle orifices 66 is joined to a lower face of the channel formation substrate 60 by adhesive agent, a thermal welding film or the like, to seal the pressure generating chambers 62 which are opened thereat.

A head case 68 formed with an ink supply passage (not shown) communicated with an ink cartridge (not shown) is fixed on the vibration plate 65. The above piezoelectric actuator unit 10 is accurately placed in a predetermined position within the head case 68. Specifically, the piezoelectric actuator unit 10 is fixed such that the distal end of each piezoelectric element 11 is abutted against an island portion 69 formed on a part of the vibration plate 65 opposes to an associated pressure generating chamber 62.

In the ink jet recording head thus structured, ink is supplied from the ink cartridge to the reservoir via the ink supply passage in the head case 68, and distributed to the respective pressure generating chambers 62 via the ink supply ports 64. When the voltage is applied to one piezoelectric element 11, the element is contracted to pull the vibration plate 65, thereby expanding the volume of the associated pressure generating chamber 62. After the introduced ink fills the pressure generating chamber 62, the applied voltage is canceled, so that the piezoelectric element 11 extends to the original state. The ink contained in the pressure generating chamber 62 is accordingly compressed and ejected from the nozzle orifice 66 as an ink droplet.

Figure 17:
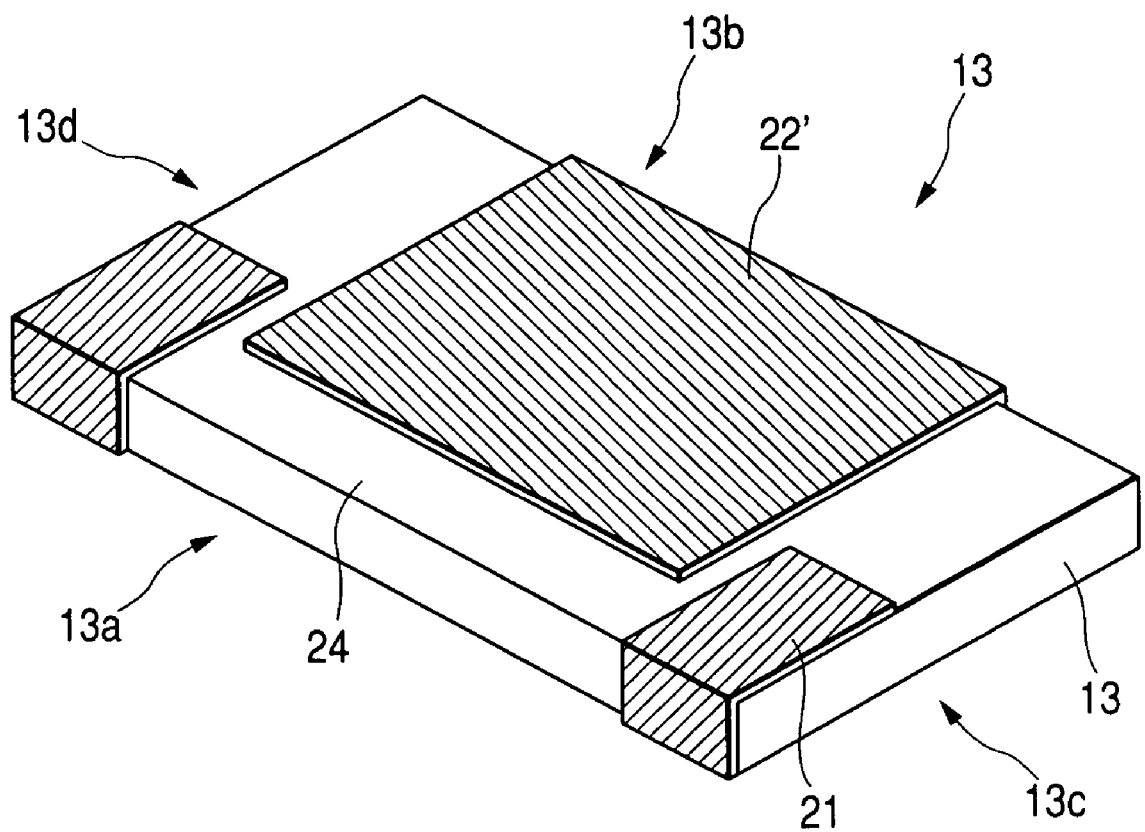
FIG. 17 is a perspective view of a piezoelectric element formation member for a piezoelectric actuator unit according to a second embodiment of the invention.

FIG. 17 shows a second embodiment of the invention. In this embodiment, a pair of external common electrodes 21 are provided on the piezoelectric element formation member 13 in the vicinity of the both side ends 13c, 13d thereof. In each of the external common electrodes 21, the width of a part formed on the proximal end 13a and the width of a part formed on the top face are made identical. Any others are the same as those described in the first embodiment, and the repetitive explanations will be omitted.

In the configuration of the first embodiment, since the external common electrode 21 is formed on the proximal end face 13a except the regions in the vicinity of the both side ends 13c, 13d of the piezoelectric element formation member 13 (the no-electrode regions 23), the insulating layer 53 covering the drive electrodes 51 has to be formed on a part of the drive wiring 50 which faces the proximal end of the piezoelectric element formation member 13 (see FIG. 16A). If the insulating layer 53 is not formed in such a part, there is an anxiety that the external common electrode 21 and the external individual electrodes 22 are short-circuited when the drive wiring 50 is deformed. Of course, there is no such an anxiety if the insulating layer 53 is provided with sufficient accuracy.

Figure 18A:
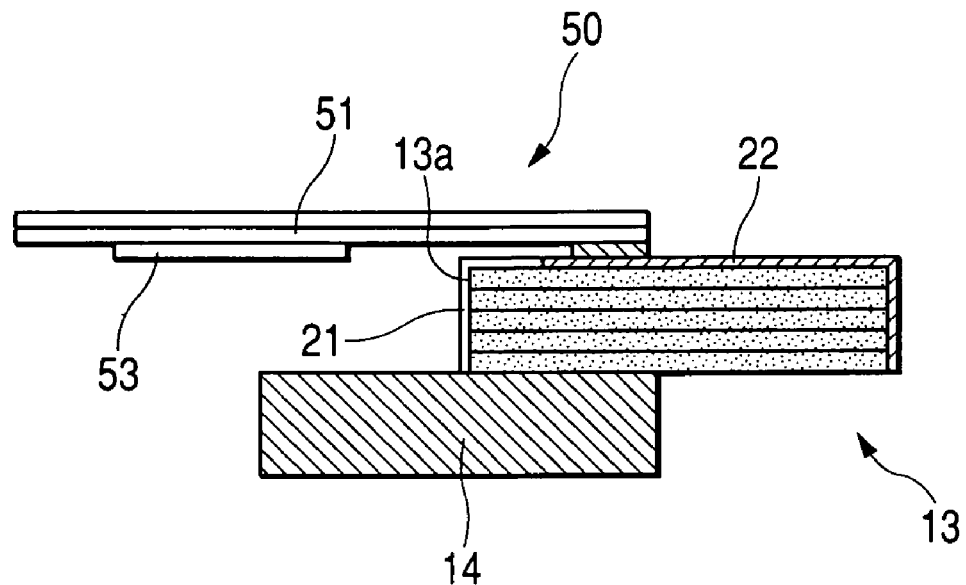
FIGS. 18A and 18B are section views for explaining advantages of the piezoelectric actuator unit of FIG. 17.
Figure 18B:
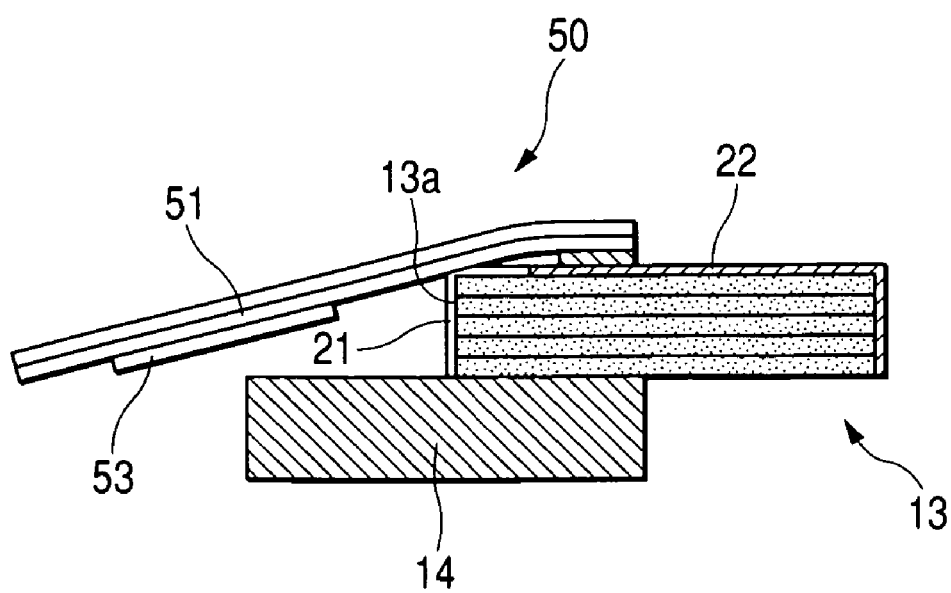

In this embodiment, in the proximal end face 13a, the external common electrodes 21 is not formed on at least a part corresponding to the region where the external individual electrodes 22 are formed. Accordingly, as shown in FIGS. 18A and 18B, there is no anxiety that the external common electrodes 21 and the external individual electrodes 22 are short-circuited even when the drive wiring 50 in which the insulating layer is not formed on the part opposing to the proximal end of the piezoelectric element formation member 13 is deformed. In addition, since it is not necessary to provide the insulating layer 53 with high accuracy, the fabrication of the drive wiring 50 can be facilitated.

Figure 19:
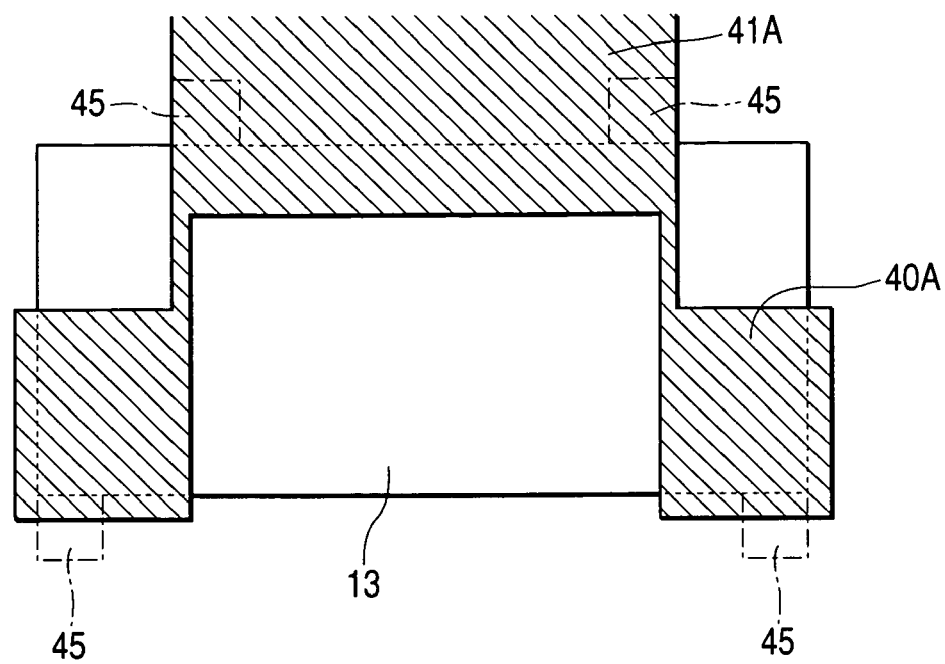
FIG. 19 is a plan view showing how to manufacture the piezoelectric element formation member of FIG. 17.

The above external common electrodes 21 and the conductive layer 22' are formed by a mask member 40A shown in FIG. 19. Since the mask member 40A is supported by a support member 41A having a width identical with the interval between the pair of external common electrodes 21, the mask member 40A can be retained at a predetermined position with sufficient stability. Accordingly, the external common electrodes 21 and the conductive layer 22' are formed with high accuracy.

Depending on the conditions for depositing or sputtering the metal material to be the external common electrodes 21, a thinner electrode layer may be formed on a part of the proximal end face 13a opposing to the support member 41A. In such a case, as described the above, the insulating layer 53 has to be provided on the drive wiring 50 with sufficient accuracy.

Figure 20:
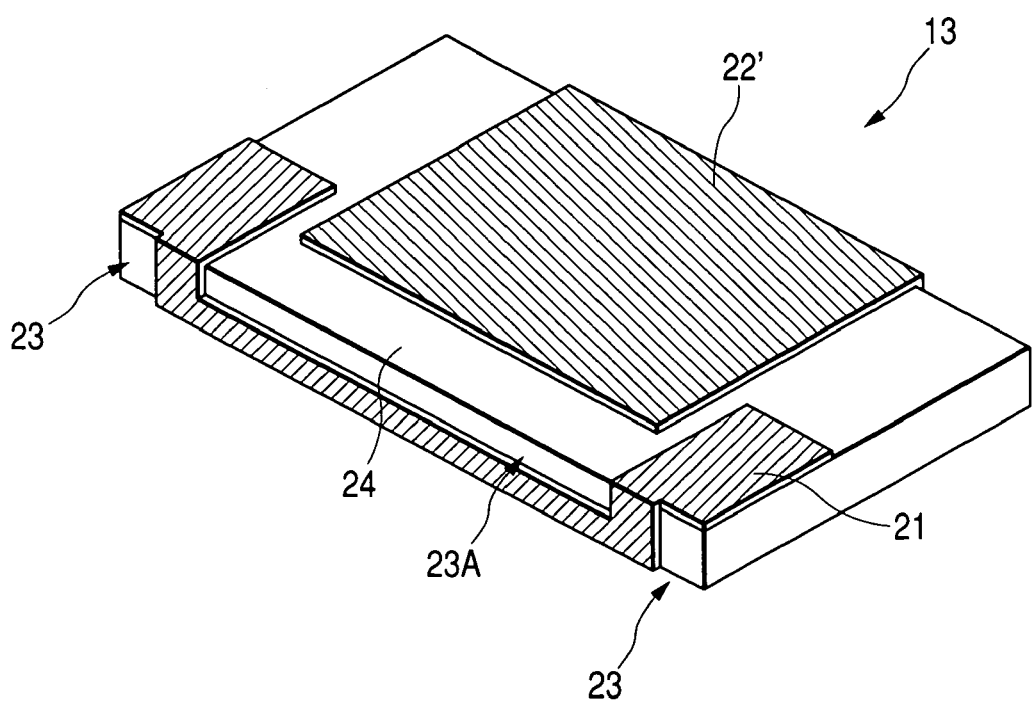
FIG. 20 is a perspective view of a piezoelectric element formation member for a modified example of the piezoelectric actuator unit of FIG. 17.

In this embodiment, the external common electrodes 21 are formed on parts of the proximal end face 13a in the vicinity of the both side ends 13c, 13d. However, as shown in FIG. 20, a single external common electrode 21 may be provided so as to extend through a bottom end of the proximal end face 13a. In other words, the only requirement is that a no-electrode region 23A is formed at least in the top end of the proximal end face 13a.

Figure 21A:
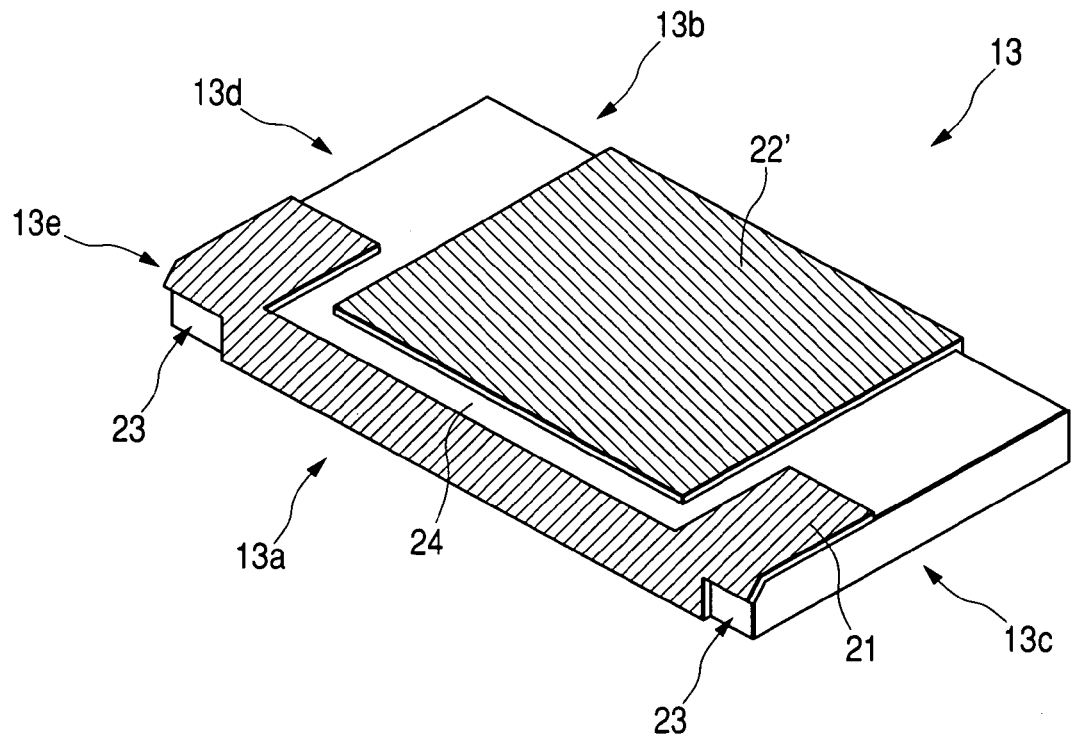
FIG. 21A is a perspective view of a piezoelectric element formation member for a piezoelectric actuator unit according to a third embodiment of the invention.

FIG. 21A shows a third embodiment of the invention. In this embodiment, a corner 13e connecting the proximal end face 13a and the top face of the piezoelectric element formation member 13 is chamfered. Any others are the same as those described in the first embodiment, and the repetitive explanations will be omitted.

Figure 21B:
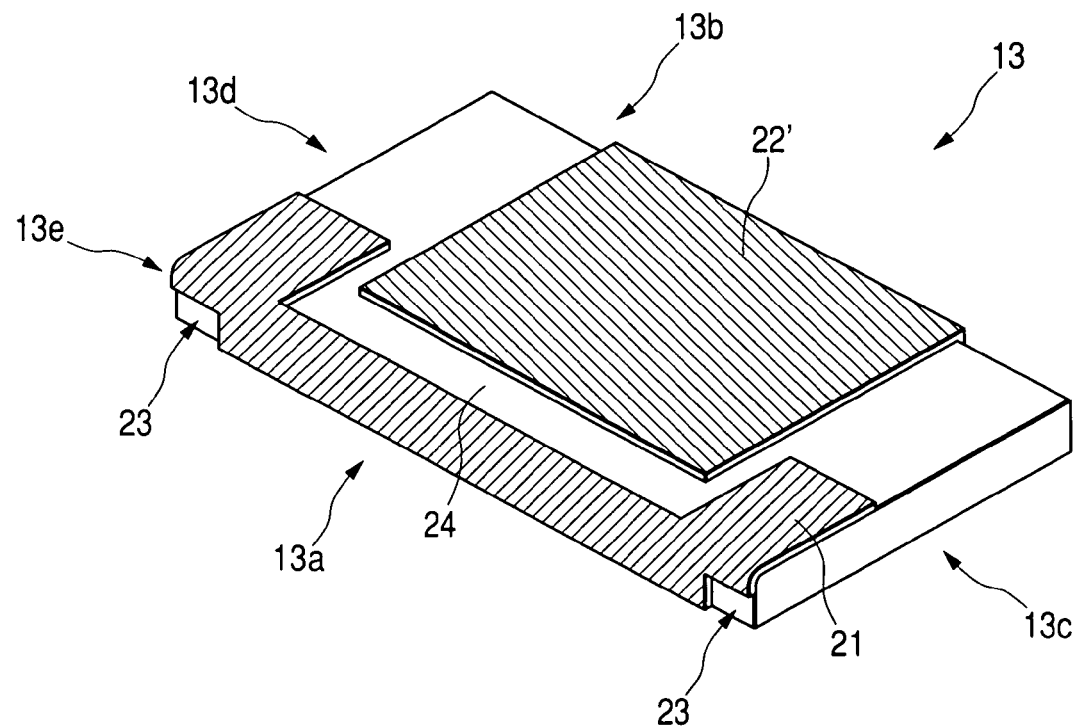
FIG. 21B is a perspective view of a piezoelectric element formation member for a modified example of the piezoelectric actuator unit of FIG. 21A.

In such a configuration, the external common electrode 21 can be favorably formed, so that the connection failure due to the breakage of the external common electrode 21 can be avoided. Specifically, since it is relatively difficult to deposit or sputter the metal material on the angled corner, the external common electrode 21 thus formed on the angled corner likely be thinned, so that there is an anxiety that the above described breakage may occur. However, in this embodiment, since the external common electrode 21 having a desired thickness is formed also on the corner 13e, not only such an anxiety can be eliminated but also the resistance of the external common electrode 21 can be lowered even if the thickness thereof is entirely reduced. Alternatively, as shown in FIG. 21B, the corner 13a may be rounded.

Figure 22:
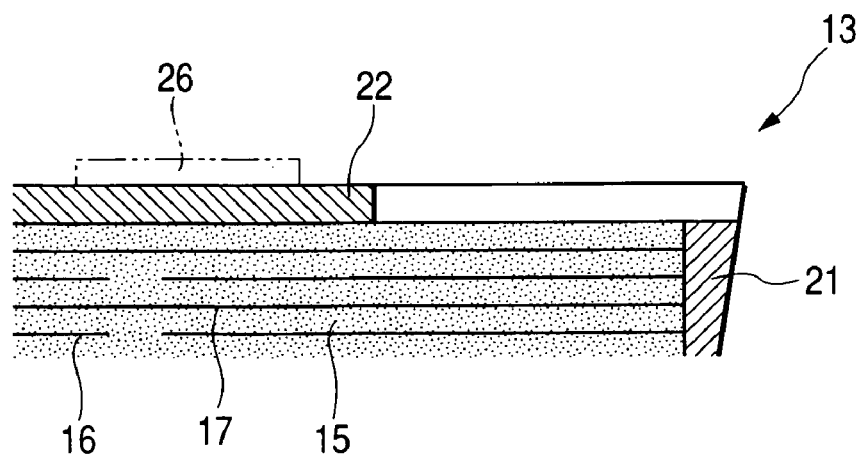
FIG. 22 is an enlarged section view of a piezoelectric element formation member for a piezoelectric actuator unit according to a fourth embodiment of the invention.

FIG. 22 shows a fourth embodiment of the invention. In this embodiment, the thickness of the external common electrode 21 formed on the proximal end face 13a of the piezoelectric element formation member 13 is reduced toward the bottom face thereof. Any others are the same as those described in the first embodiment, and the repetitive explanations will be omitted.

Figure 9B:
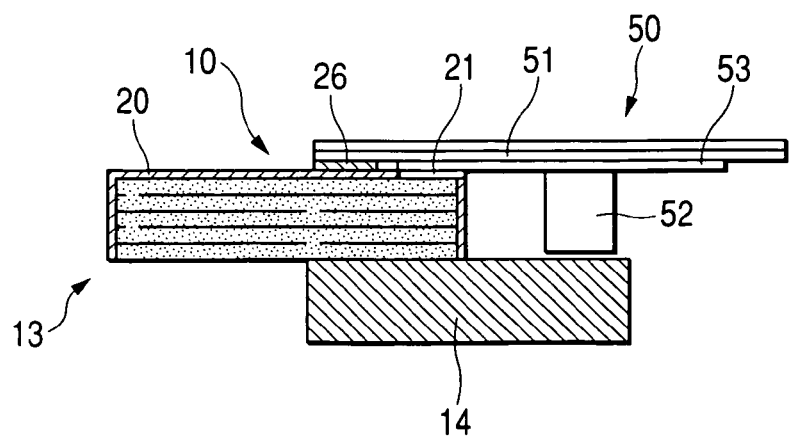
FIG. 9B is a section view taken along a line IXB—IXB in FIG. 8A.

As described the above, the internal individual electrode 16 and internal common electrode 17 are laminated in the piezoelectric element formation member 13, and the voltage is applied therebetween from the drive wiring 50 via the contacts 26 provided on the external common electrode 21 and the external individual electrode 22 (see FIG. 9B). Incidentally, the current value in the external common electrode 21 becomes smaller as being away from the contacts 26. Thus, it is not necessary to make the thickness of the external common electrode 21 uniform in the thickness direction of the piezoelectric element formation member 13. By reducing the thickness of the external common electrode 21 toward the bottom face of piezoelectric element formation member 13 as described the above, the material cost can be reduced.

Figure 23:
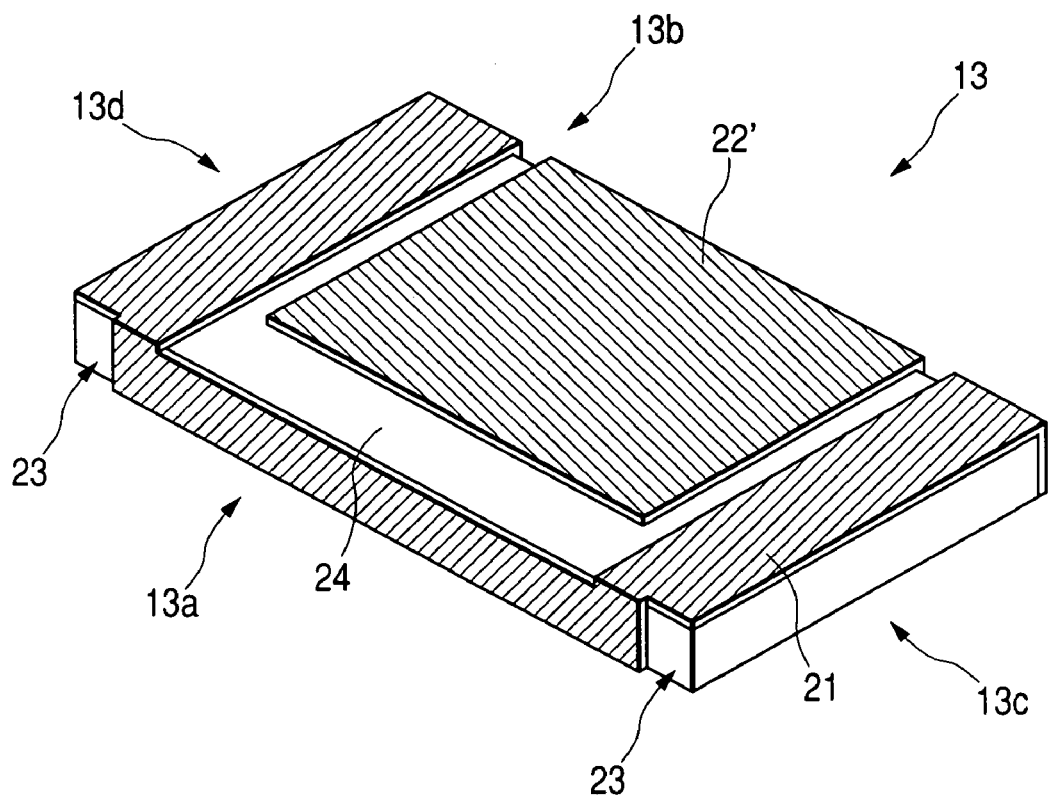
FIG. 23 is a perspective view of a piezoelectric element formation member for a piezoelectric actuator unit according to a fifth embodiment of the invention.
Figure 24:
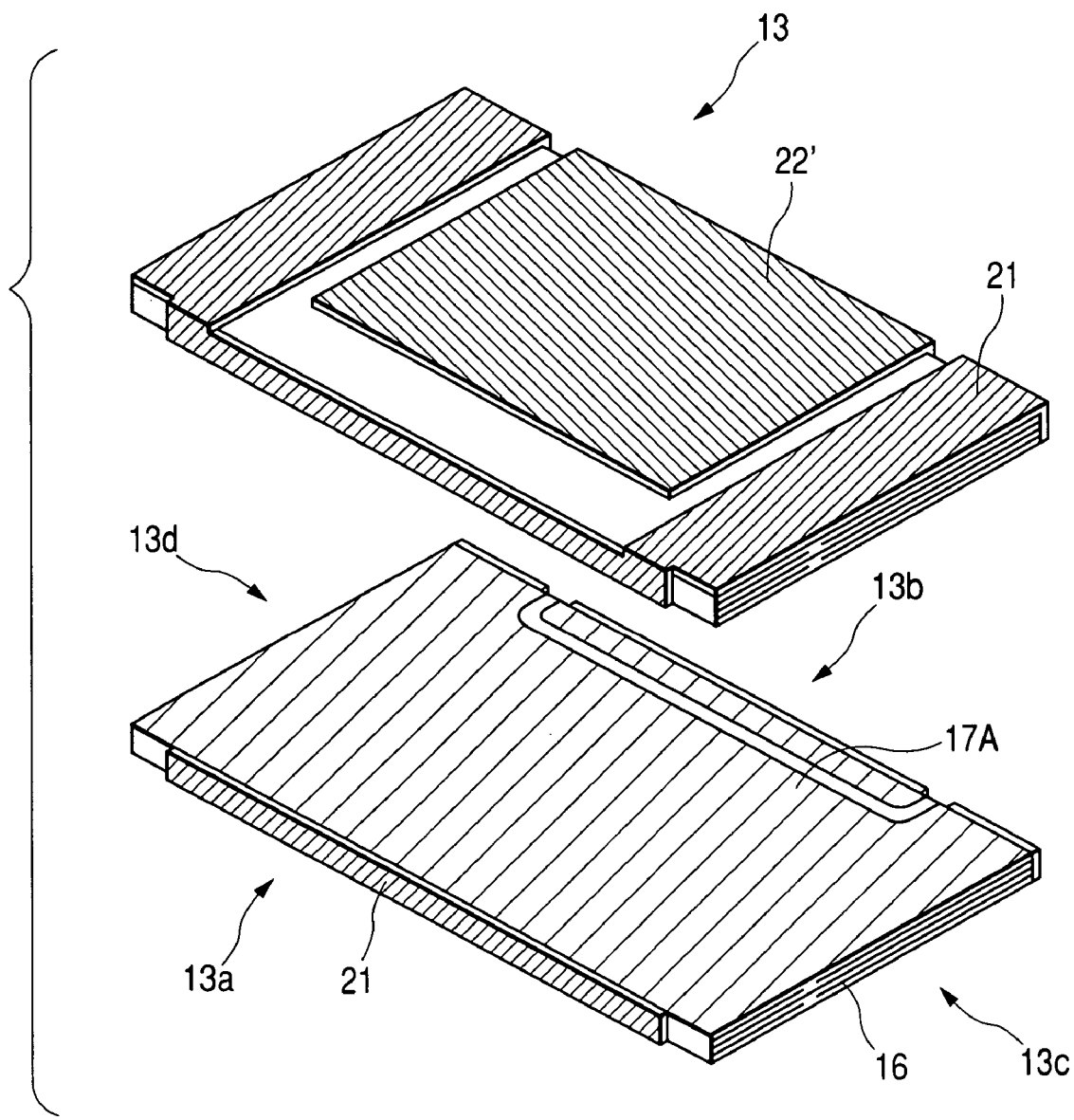
FIG. 24 is an exploded perspective view of the piezoelectric element formation member of FIG. 23.

FIG. 23 shows a fifth embodiment of the invention. In this embodiment, the external common electrode 21 is continuously extended to the distal end face 13b of the piezoelectric element formation member 13. As shown in FIG. 24, each of the internal common electrode layers 17A is exposed to both of the proximal end face 13a and the distal end face 13b at the vicinity of the both side ends 13c, 13d of the piezoelectric element formation member 13, so that the electric connection with the external common electrode 21 is established at both of the proximal end face 13a and the distal end face 13b. Further, the distal end section of each internal common electrode layer 17A situated at the inside of the boundaries between the arrayed piezoelectric elements 11 and the positioning members 19 is isolated from the parts exposed to the distal end face 13b. Any others are the same as those described in the first embodiment, and the repetitive explanations will be omitted.

In such a configuration, the resistances of the external common electrode 21 and the internal common electrodes 17A can be lowered. Since the voltage drop can be avoided even when the plural piezoelectric elements 11 are simultaneously driven, the stable actuation of the piezoelectric elements 11 can be attained.

Figure 25:
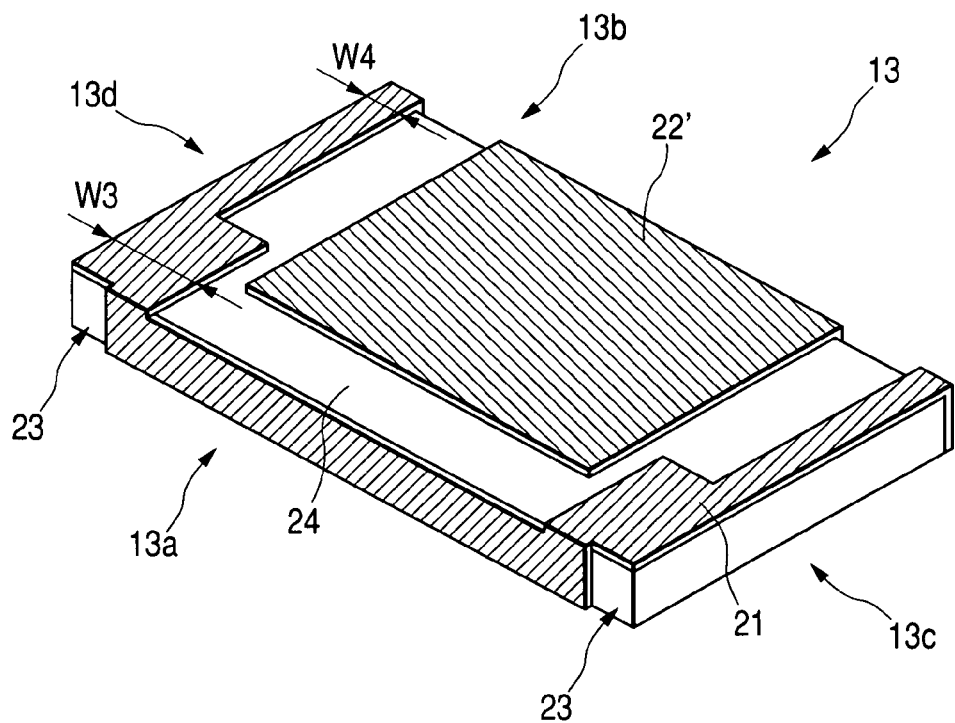
FIG. 25 is a perspective view of a piezoelectric element formation member for a first modified example of the piezoelectric actuator unit of FIG. 24.

In this embodiment, the width of a part of the external common electrodes 21 formed on the top face of the piezoelectric element formation member 13 and that formed on the distal end face 13b are made identical. However, as shown in FIG. 25, the width W3 of the external common electrode 21 formed on the proximal end section of the top face may be wider than the width W4 of that formed on the distal end section of the top face and the distal end face 13b. The only requirement is that the width of a part of the external common electrode 21 on which the contacts 26 for the drive wiring 50 is made relatively wide. In such a configuration, since the area of the mask member is relatively large, the external common electrode 21 and the conductive layer 22' can be formed with high accuracy.

Figure 26:
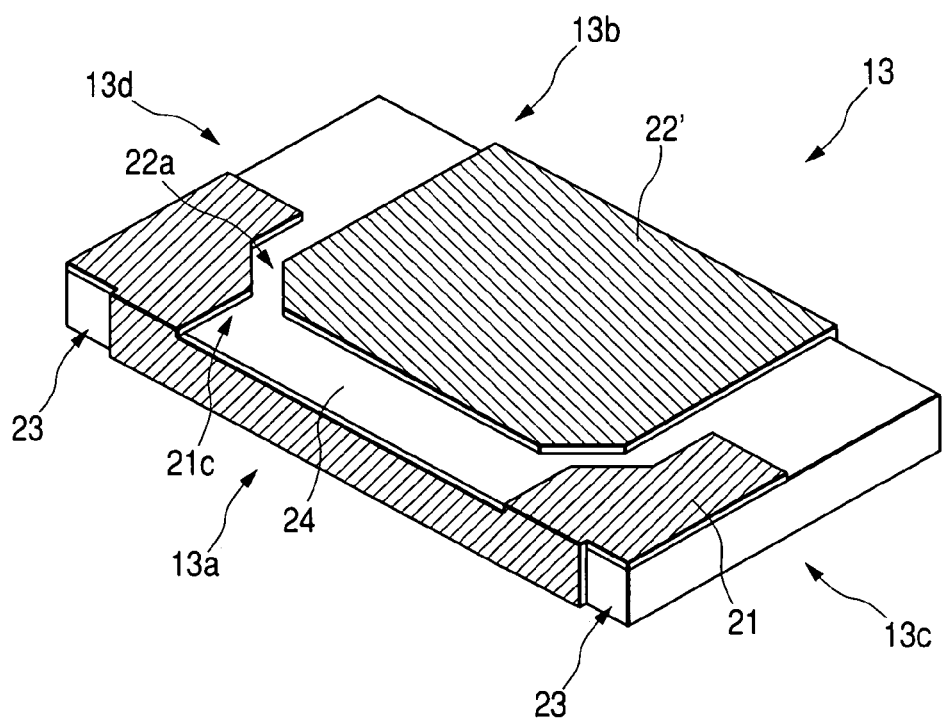
FIG. 26 is a perspective view of a piezoelectric element formation member for a second modified example of the piezoelectric actuator unit of FIG. 24.

As shown in FIG. 26, the proximal side end of the conductive layer 22' may be made narrower, while the parts of the external common electrode 21 opposing to the narrowed part may be made wider. Specifically, the proximal end corners of the conductive layer 22' are chamfered to form a narrowed part 22a, while the external common electrode 21 is extended so as to be parallel with the narrowed part 22a to form a widened part 21c. In such a configuration, the resistance of the external common electrode 21 is lowered so that the stable actuation of the piezoelectric elements 11 can be attained. The narrowed part 22a may be formed by rounding the proximal end corners of the conductive layer 22'.

Figure 27:
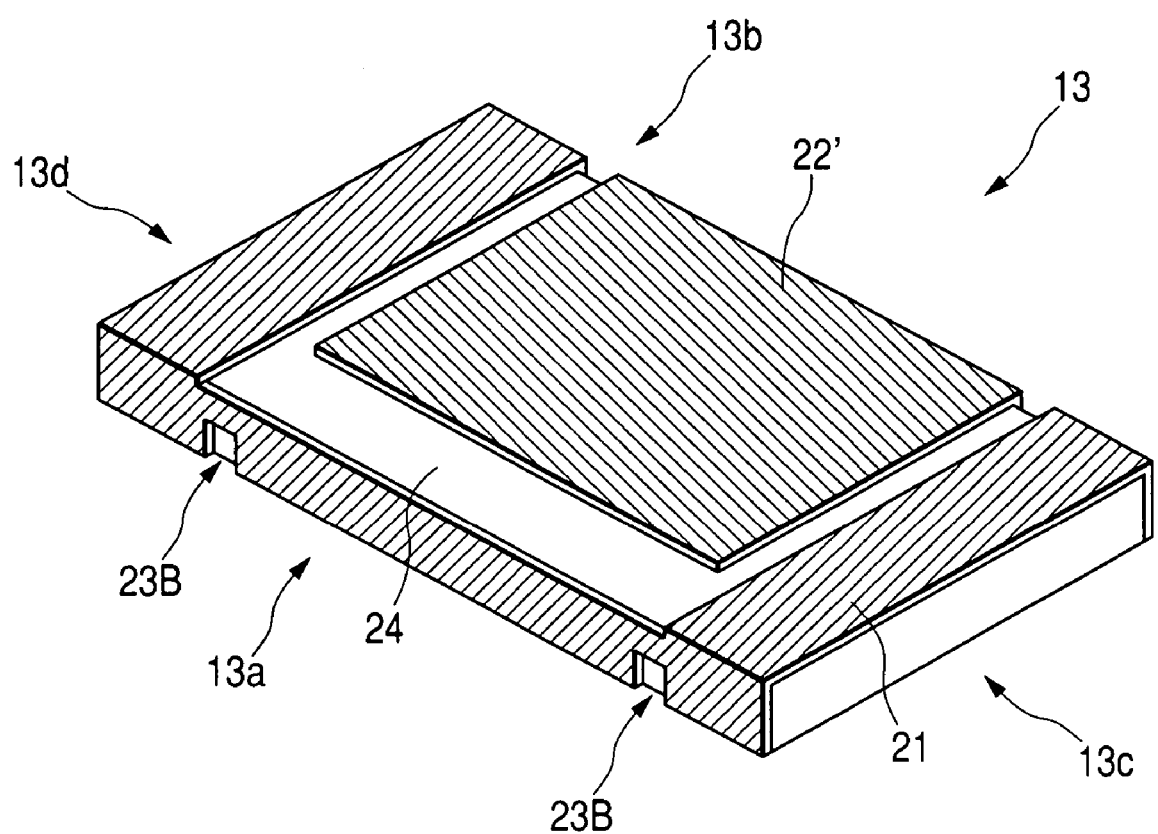
FIG. 27 is a perspective view of a piezoelectric element formation member for a third modified example of the piezoelectric actuator unit of FIG. 24.

In this embodiment, the external common electrode 21 is formed on the proximal end face 13a of the piezoelectric element formation member 13 except the regions in the vicinity of the both side ends 13c, 13d thereof. However, as shown in FIG. 27, the external common electrode 21 may be formed entirely on the proximal end face 13a except no-electrode regions 23B situated in the bottom end side of the proximal end face 13a while being away from the both side ends 13c, 13d.

The no-electrode regions 23B are formed by retaining the piezoelectric element formation member 13 with the retaining projections of the holder (not shown) during the deposition or sputtering of the metal material.

In such a configuration, the resistances of the external common electrode 21 having a relatively large area can be lowered. Since the voltage drop can be avoided even when the plural piezoelectric elements 11 are simultaneously driven, the stable actuation of the piezoelectric elements 11 can be attained.

Although the position of each no-electrode region 23B is not limited, it is preferably arranged inner than a part corresponding to the widthwise center of the external common electrode 21 formed on the top face of the piezoelectric element formation member 13.

In the above embodiment, the ink jet recording head is exemplified as the liquid ejection head. As another examples of the liquid ejection head, there may be exemplified a recording head installed in an image forming apparatus such as a printer, a coloring material ejection head used for manufacturing a color filter installed in a liquid crystal display or the like, an electrode material ejection head used for forming electrodes installed in an organic EL display, a field emission display or the like, and an organic compound ejection head used for manufacturing a biochip.

What is claimed is:

1. A piezoelectric element formation member, comprising:
    a substrate, in which first internal electrode layers and second internal electrode layers are alternately laminated while sandwiching piezoelectric layers therebetween, the first internal electrode layers being exposed to at least a first end face of the substrate, and the second internal electrode layers being exposed to at least a second end face of the substrate which is opposite to the first end face;
    a first external electrode layer formed on the first end face and a third end face connecting the first end face and the second end face, the first external electrode layer being electrically connected to the first internal electrode layers; and
    a second external electrode layer formed on at least the second end face and the third end face, the second external electrode layer being electrically connected to the second internal electrode layers, and being electrically independent from the first external electrode layer, wherein:
    the first external electrode layer and the first internal electrode layers are to be divided by slits extending from the first end face to form a plurality of piezoelectric elements arrayed in a first direction;
    a part of the first external electrode layer and a part of the second external electrode layer are adjacent in the first direction at a first region in the third end face,
    a first part of the second external electrode layer is disposed adjacent to a first side of the first external electrode layer on the third end face;
    a second part of the second external electrode layer is disposed adjacent to a second side of the first external electrode layer on the third end face; and a third part of the second external electrode layer is disposed on the second end face and connects the first part and second part so that the second external electrode layer on the second end face is formed except a region which is in the vicinity of a corner connecting the second end face and the third end face and opposing to the first external electrode layer.

2. A piezoelectric element formation member, comprising:
- a substrate, in which first internal electrode layers and second internal electrode layers are alternately laminated while sandwiching piezoelectric layers therebetween, the first internal electrode layers being exposed to at least a first end face of the substrate, and the second internal electrode layers being exposed to at least a second end face of the substrate which is opposite to the first end face;
- a first external electrode layer formed on the first end face and a third end face connecting the first end face and the second end face, the first external electrode layer being electrically connected to the first internal electrode layers; and
- a second external electrode layer formed on at least the second end face and the third end face, the second external electrode layer being electrically connected to the second internal electrode layers, and being electrically independent from the first external electrode layer, wherein:
- the first external electrode layer and the first internal electrode layers are to be divided by slits extending from the first end face to form a plurality of piezoelectric elements arrayed in a first direction;
- a part of the first external electrode layer and a part of the second external electrode layer are adjacent in the first direction at a first region in the third end face; and
- the second external electrode layer formed on the third end face is extend to the vicinity of the first end face.

3. The piezoelectric element formation member as set forth in claim 2, wherein the second external electrode layer is extended to regions in the first end face which are in the vicinity of both side ends of the first end face, and the first external electrode layer formed on the first end face is situated between the regions.

4. The piezoelectric element formation member as set forth in claim 2, wherein a width of the second external electrode layer formed on the third end face and closer to the first end face is narrower than a width of the second external electrode layer formed on the third end face and closer to the second end face.

5. A piezoelectric element formation member, comprising:
- a substrate, in which first internal electrode layers and second internal electrode layers are alternately laminated while sandwiching piezoelectric layers therebetween, the first internal electrode layers being exposed to at least a first end face of the substrate, and the second internal electrode layers being exposed to at least a second end face of the substrate which is opposite to the first end face;
- a first external electrode layer formed on the first end face and a third end face connecting the first end face and the second end face, the first external electrode layer being electrically connected to the first internal electrode layers; and
- a second external electrode layer formed on at least the second end face and the third end face, the second external electrode layer being electrically connected to the second internal electrode layers, and being electrically independent from the first external electrode layer, wherein:
- the first external electrode layer and the first internal electrode layers are to be divided by slits extending from the first end face to form a plurality of piezoelectric elements arrayed in a first direction;
- a part of the first external electrode layer and a part of the second external electrode layer are adjacent in the first direction at a first region in the third end face; and
- an end portion of the first external electrode layer formed on the third end face and closer to the second end face is narrowed.

6. The piezoelectric element formation member as set forth in claim 1, wherein the second external electrode layer is continuously extended from the second end face to the third end face.

7. A piezoelectric element formation member, comprising:
- a substrate, in which first internal electrode layers and second internal electrode layers are alternately laminated while sandwiching piezoelectric layers therebetween, the first internal electrode layers being exposed to at least a first end face of the substrate, and the second internal electrode layers being exposed to at least a second end face of the substrate which is opposite to the first end face;
- a first external electrode layer formed on the first end face and a third end face connecting the first end face and the second end face, the first external electrode layer being electrically connected to the first internal electrode layers; and
- a second external electrode layer formed on at least the second end face and the third end face, the second external electrode layer being electrically connected to the second internal electrode layers, and being electrically independent from the first external electrode layer, wherein:
- the first external electrode layer and the first internal electrode layers are to be divided by slits extending from the first end face to form a plurality of piezoelectric elements arrayed in a first direction;
- a part of the first external electrode layer and a part of the second external electrode layer are adjacent in the first direction at a first region in the third end face; and
- the second external electrode layer is continuously extended from the third end face to a fourth end face and a fifth end face respectively connecting the first end face, the second end face and the third end face.

8. The piezoelectric element formation member as set forth in claim 1, wherein a corner of the substrate between the second end face and the third end face is chamfered.

9. A piezoelectric element formation member, comprising:
- a substrate, in which first internal electrode layers and second internal electrode layers are alternately laminated while sandwiching piezoelectric layers therebetween, the first internal electrode layers being exposed to at least a first end face of the substrate, and the second internal electrode layers being exposed to at least a second end face of the substrate which is opposite to the first end face;
- a first external electrode layer formed on the first end face and a third end face connecting the first end face and the second end face, the first external electrode layer being electrically connected to the first internal electrode layers; and a second external electrode layer formed on at least the second end face and the third end face, the second external electrode layer being electrically connected to the second internal electrode layers, and being electrically independent from the first external electrode layer, wherein:

the first external electrode layer and the first internal electrode layers are to be divided by slits extending from the first end face to form a plurality of piezoelectric elements arrayed in a first direction;

a part of the first external electrode layer and a part of the second external electrode layer are adjacent in the first direction at a first region in the third end face; and a thickness of the second external electrode layer formed on the second end face is reduced toward a fourth end face which is opposite to the third end face.

10. A piezoelectric element formation member, comprising:

a substrate, in which first internal electrode layers and second internal electrode layers are alternately laminated while sandwiching piezoelectric layers therebetween, the first internal electrode layers being exposed to at least a first end face of the substrate, and the second internal electrode layers being exposed to at least a second end face of the substrate which is opposite to the first end face;

a first external electrode layer formed on the first end face and a third end face connecting the first end face and the second end face, the first external electrode layer being electrically connected to the first internal electrode layers; and a second external electrode layer formed on at least the second end face and the third end face, the second external electrode layer being electrically connected to the second internal electrode layers, and being electrically independent from the first external electrode layer, wherein:

the first external electrode layer and the first internal electrode layers are to be divided by slits extending from the first end face to form a plurality of piezoelectric elements arrayed in a first direction;

a part of the first external electrode layer and a part of the second external electrode layer are adjacent in the first direction at a first region in the third end face;

the second external electrode layer is formed on the second end face except regions which are in the vicinity of both side ends thereof and extending in a second direction perpendicular to the third end face; and a width of each of the regions is narrowed toward the third end face.

11. The piezoelectric element formation member as set forth in claim 1, wherein the second external electrode layer is formed on the second end face except a region which is in the vicinity of a corner connecting the second end face and a fourth end face which is opposite to the third end face.

12. The piezoelectric element formation member as set forth in claim 2, wherein the second external electrode layer is formed entirely on the second end face.

13. A piezoelectric element formation member, comprising:

a substrate, in which first internal electrode layers and second internal electrode layers are alternately laminated while sandwiching piezoelectric layers therebetween, the first internal electrode layers being exposed to at least a first end face of the substrate, and the second internal electrode layers being exposed to at least a second end face of the substrate which is opposite to the first end face;

a first external electrode layer formed on the first end face and a third end face connecting the first end face and the second end face, the first external electrode layer being electrically connected to the first internal electrode layers; and a second external electrode layer formed on at least the second end face and the third end face, the second external electrode layer being electrically connected to the second internal electrode layers, and being electrically independent from the first external electrode layer, wherein:

the first external electrode layer and the first internal electrode layers are to be divided by slits extending from the first end face to form a plurality of piezoelectric elements arrayed in a first direction;

a part of the first external electrode layer and a part of the second external electrode layer are adjacent in the first direction at a first region in the third end face; and the second external electrode layer formed on the second end face is partially thinned.

14. A piezoelectric element formation unit, wherein a fourth end face opposite to the third end face of the piezoelectric element formation member as set forth in claim 1 is joined to a fixation board in a cantilevered manner, such that a portion of the piezoelectric element formation member closer to the first end face becomes a free end face.

15. A piezoelectric actuator unit, wherein at least a portion of the piezoelectric element formation member which is cantilevered by the fixation board as set forth in claim 14 is pectinated by the slits.

16. The piezoelectric actuator unit as set forth in claim 15, wherein the slits are extended to at least an end of the first external electrode layer formed on the third end face and closer to the second end face.

17. A liquid ejection head, comprising:

the piezoelectric actuator unit as set forth in claim 15;

a drive wiring, comprising a plurality of drive electrodes electrically connected, through contacts, to the divided ones of the first external electrode layer and the second external electrode layer, to supply signals for driving the piezoelectric elements; and a vibration plate, which forms a part of each of pressure generating chambers communicated with a nozzle orifice from which an ink droplet is ejected, wherein the second end face of the substrate is abutted against the vibration plate such that distal ends of the piezoelectric elements are associated with the respective pressure generating chambers.

18. The liquid ejection head as set forth in claim 17, wherein the contacts are arrayed in the first direction at the first region.

19. A piezoelectric actuator unit, wherein a fourth end face opposite to the third end face of the piezoelectric element formation member as set forth in claim 2 is joined to a fixation board in a cantilevered manner such that a portion of the piezoelectric element formation member closer to the first end face becomes a free end face; and at least a portion of the piezoelectric element formation member which is cantilevered by the fixation board is pectinated by the slits.

20. A piezoelectric actuator unit, wherein a fourth end face opposite to the third end face of the piezoelectric element formation member as set forth in claim 5 is joined to a fixation board in a cantilevered manner such that a portion of the piezoelectric element formation member closer to the first end face becomes a free end face; and at least a portion of the piezoelectric element formation member which is cantilevered by the fixation board is pectinated by the slits.

21. A piezoelectric actuator unit, wherein a fourth end face opposite to the third end face of the piezoelectric element formation member as set forth in claim 7 is joined to a fixation board in a cantilevered manner such that a portion of the piezoelectric element formation member closer to the first end face becomes a free end face; and at least a portion of the piezoelectric element formation member which is cantilevered by the fixation board is pectinated by the slits.

22. A piezoelectric actuator unit, wherein a fourth end face opposite to the third end face of the piezoelectric element formation member as set forth in claim 9 is joined to a fixation board in a cantilevered manner such that a portion of the piezoelectric element formation member closer to the first end face becomes a free end face; and at least a portion of the piezoelectric element formation member which is cantilevered by the fixation board is pectinated by the slits.

23. A piezoelectric actuator unit, wherein a fourth end face opposite to the third end face of the piezoelectric element formation member as set forth in claim 10 is joined to a fixation board in a cantilevered manner such that a portion of the piezoelectric element formation member closer to the first end face becomes a free end face; and at least a portion of the piezoelectric element formation member which is cantilevered by the fixation board is pectinated by the slits.

24. A piezoelectric actuator unit, wherein a fourth end face opposite to the third end face of the piezoelectric element formation member as set forth in claim 13 is joined to a fixation board in a cantilevered manner such that a portion of the piezoelectric element formation member closer to the first end face becomes a free end face; and at least a portion of the piezoelectric element formation member which is cantilevered by the fixation board is pectinated by the slits.

* * * * *